US011480839B2

(12) United States Patent
Yokota et al.

(10) Patent No.: US 11,480,839 B2
(45) Date of Patent: Oct. 25, 2022

(54) ELECTRO-OPTICAL DEVICE AND ELECTRONIC APPARATUS

(71) Applicant: SEIKO EPSON CORPORATION, Tokyo (JP)

(72) Inventors: Tomoki Yokota, Suwa (JP); Kikuya Morita, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 17/692,180

(22) Filed: Mar. 11, 2022

(65) Prior Publication Data
US 2022/0291560 A1    Sep. 15, 2022

(30) Foreign Application Priority Data

Mar. 12, 2021    (JP) .................................. 2021-039804

(51) Int. Cl.
*G02F 1/1362* (2006.01)
*G02F 1/1368* (2006.01)
*H01L 27/12* (2006.01)

(52) U.S. Cl.
CPC ...... *G02F 1/136286* (2013.01); *G02F 1/1368* (2013.01); *G02F 1/136209* (2013.01); *H01L 27/124* (2013.01); *H01L 27/1218* (2013.01); *H01L 27/1255* (2013.01)

(58) Field of Classification Search
CPC ......... G02F 1/136286; G02F 1/136209; G02F 1/1368
See application file for complete search history.

(56) References Cited

U.S. PATENT DOCUMENTS

| 2007/0182874 A1* | 8/2007 | Kamijima ............ G09G 3/3611 349/44 |
| 2018/0203314 A1 | 7/2018 | Sugimoto |

FOREIGN PATENT DOCUMENTS

| JP | 2003152086 | 5/2003 |
| JP | 2004325627 | 11/2004 |
| JP | 2004334064 | 11/2004 |
| JP | 2004363300 | 12/2004 |
| JP | 2006064967 | 3/2006 |
| JP | 2018116077 | 7/2018 |

* cited by examiner

Primary Examiner — James A Dudek
(74) Attorney, Agent, or Firm — JCIPRNET

(57) ABSTRACT

In a substrate body of an electro-optical device, a first groove, and a second groove extending in a direction intersecting the first groove are formed. A capacitance element is constituted by a layered film that includes a first conductive film, a dielectric film, and a second conductive film sequentially layered in a region including the first groove and the second groove. When the first groove and the second groove intersect, the intersection becomes wide during etching. However, when the first groove and the second groove do not intersect, such as when the first groove and the second groove are spaced apart, a wide portion is less likely to be generated. Accordingly, the first insulating film easily fills the grooves.

13 Claims, 22 Drawing Sheets

ELECTRO-OPTICAL DEVICE AND ELECTRONIC APPARATUS

The present application is based on, and claims priority from JP Application Serial Number 2021-039804, filed Mar. 12, 2021, the disclosure of which is hereby incorporated by reference herein in its entirety.

BACKGROUND

1. Technical Field

The present disclosure relates to an electro-optical device and an electronic apparatus.

2. Related Art

In electro-optical devices such as liquid crystal devices, a structure is widely adopted in which a capacitance element is provided between the pixel electrode and the substrate body, and in which the voltage of the pixel electrode is held by the capacitance element. Since it is generally constituted by a conductive layer having light-shielding properties, the capacitance element is generally provided in a region overlapping a scanning line or a data line in plan view. On the other hand, it is desirable that the capacitance element has a large capacitance. Thus, a structure has been proposed in which a groove is provided in a region overlapping the capacitance element in plan view, and in which the capacitance of the capacitance element is increased utilizing the sidewalls of the groove (see JP-A-2004-363300). JP-A-2004-363300 proposes a structure in which one first groove extending along a data line and one second groove extending along a scanning line are disposed in an L-shape.

In the configuration described in JP-A-2004-363300, a structure is conceivable in which the first groove and the second groove are extended so as to intersect each other, for example, in order to further expand the grooves and increase the capacitance of the capacitance elements. When the first groove and the second groove are caused to intersect each other, however, the opening width in directions diagonal to both the first groove and the second groove at the intersection between the first groove and the second groove is increased during etching, so recesses are less likely to be filled even after the capacitance element or the insulating film is formed. Therefore, when forming an element such as a capacitance element utilizing grooves extending in mutually intersecting directions, recesses resulting from the grooves cannot be easily filled.

SUMMARY

In order to solve the above-described problems, an electro-optical device according to an aspect of the present disclosure includes: a substrate body including a first groove and a second groove provided away from the first groove and extending along a direction intersecting an extending direction of the first groove, a layered film including a first conductive film, a dielectric film, and a second conductive film sequentially layered in a region overlapping the first groove and the second groove, and a first insulating film covering the layered film.

The electro-optical device according to the present disclosure is used for various electronic apparatuses.

DESCRIPTION OF EXEMPLARY EMBODIMENTS

Figure 1:
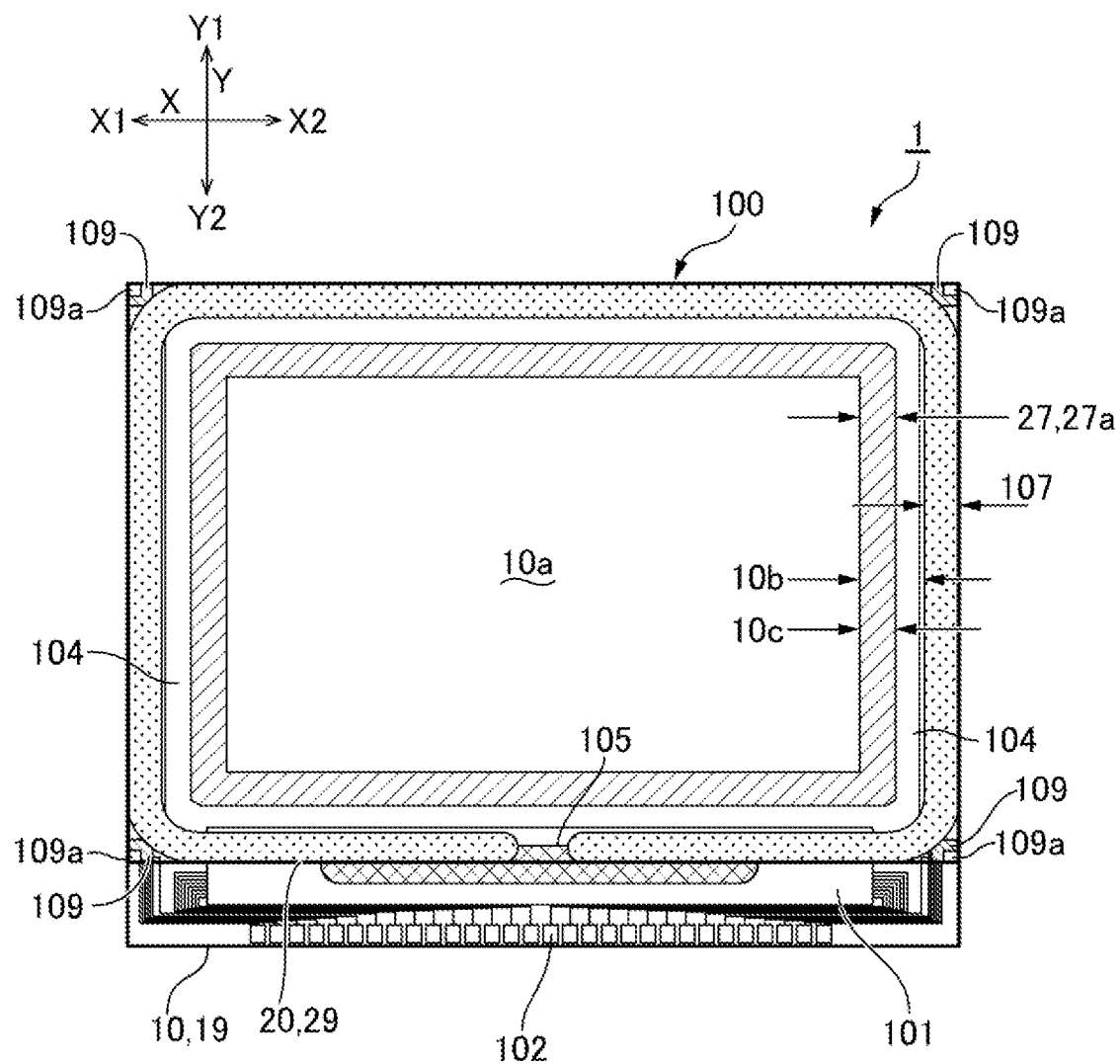
FIG. 1 is a plan view illustrating an aspect of an electro-optical device according to Embodiment 1 of the present disclosure.

Embodiments of the present disclosure will be described below with reference to the drawings. Note that, in each of the figures referred to in the following description, to illustrate each layer and each member at a recognizable size in the drawings, each layer and each member are illustrated at a different scale. Furthermore, in the following description, of two in-plane directions intersecting each other of a first substrate 10, a "first direction" is the X-axis direction, while a "second direction" is the Y-axis direction. Furthermore, in describing a layer formed at the first substrate 10, an upper layer side or a front surface side represents an opposite side from a side on which a substrate is located (a side on which a counter substrate is located), while a lower layer side represents the side on which the substrate is located.

Embodiment 1

Configuration of Electro-optical Device

Figure 2:
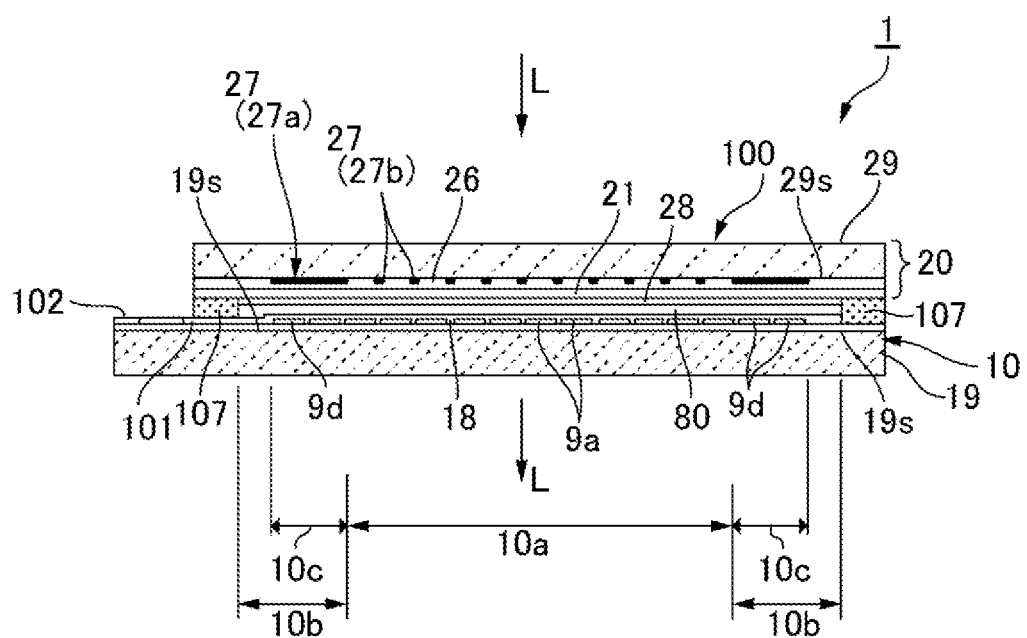
FIG. 2 is a cross-sectional view of the electro-optical device illustrated in FIG. 1.

FIG. 1 is a plan view illustrating an aspect of an electro-optical device 1 according to Embodiment 1 of the present disclosure. FIG. 2 is a cross-sectional view of the electro-optical device 1 illustrated in FIG. 1. As illustrated in FIGS. 1 and 2, in the electro-optical device 1, the first substrate 10 including a substrate body 19 and a second substrate 20 including a substrate body 29 are bonded together with a predetermined gap therebetween by a seal material 107, and the first substrate 10 faces the second substrate 20. The seal material 107 is provided in a frame-like shape along the outer edge of the second substrate 20. An electro-optical layer 80 such as a liquid crystal layer is disposed in a region surrounded by the seal material 107 between the first substrate 10 and the second substrate 20. The electro-optical device 1 of the present embodiment is a liquid crystal device including a liquid crystal panel 100. The seal material 107 is a photocurable adhesive, or a photocurable and thermosetting adhesive. A gap material such as glass fiber or glass beads for setting a distance between both substrates to a predetermined value is compounded into the seal material 107. The first substrate 10 and the second substrate 20 are both a quadrangle. Substantially at the center of the electro-optical device 1, a display region 10a is provided as a quadrangular region. In correspondence to such a shape, the seal material 107 is also provided substantially in a quadrangle, and a peripheral region 10b having a rectangular frame shape is provided between an inner peripheral edge of the seal material 107 and an outer peripheral edge of the display region 10a.

The substrate body 19 includes a light-transmitting substrate such as a quartz substrate and a glass substrate. On a first surface 19s side of the substrate body 19, on an outer side of the display region 10a, a data line driving circuit 101 and a plurality of terminals 102 are formed along one side of the substrate body 19. Along other sides adjacent to this one side, scanning line driving circuits 104 are formed. A flexible wiring substrate (not illustrated) is coupled to the terminals 102. Various potentials and various signals are input to the first substrate 10 via the flexible wiring substrate.

On the first surface 19s of the substrate body 19, in the display region 10a, a plurality of light-transmitting pixel electrodes 9a formed of an indium tin oxide (ITO) film or the like, and transistors (not illustrated in FIGS. 1 and 2) electrically coupled to each of the plurality of pixel electrodes 9a are formed in a matrix pattern. A first alignment film 18 is formed at the second substrate 20 side of the pixel electrodes 9a, and the pixel electrodes 9a are covered with the first alignment film 18. Accordingly, from the substrate body 19 to the first alignment film 18 corresponds to the first substrate 10.

The substrate body 29 includes a light-transmitting substrate such as a quartz substrate and a glass substrate. On a first surface 29s side of the substrate body 29, a light-transmitting common electrode 21 formed of an ITO film or the like is formed. The common electrode 21 is formed substantially over the entire surface of the second substrate 20. A second alignment film 28 is formed at the first substrate 10 side of the common electrode 21, and the common electrode 21 is covered with the second alignment film 28. Accordingly, from the substrate body 29 to the second alignment film 28 corresponds to the second substrate 20. In the second substrate 20, a light-shielding layer 27 having light-shielding properties and formed of resin, a metal, or a metal compound is formed between the substrate body 29 and the common electrode 21, and a light-transmitting protective layer 26 is formed between the light-shielding layer 27 and the common electrode 21. The light-shielding layer 27 is formed, for example, as a partition 27a having a frame shape and extending along the outer peripheral edge of the display region 10a. In some cases, the light-shielding layer 27 is formed as a black matrix 27b in a region overlapping a region sandwiched between adjacent pixel electrodes 9a in plan view. Of the peripheral region 10b of the substrate body 19, in a region 10c overlapping the partition 27a in plan view, dummy pixel electrodes 9d concurrently formed with the pixel electrodes 9a are formed.

The first alignment film 18 and the second alignment film 28 are inorganic alignment films formed of a diagonally vapor-deposited film of $SiO_x$ (x<2), $SiO_2$, $TiO_2$, MgO, $Al_2O_3$, or the like, and align liquid crystal molecules having negative dielectric anisotropy used in the electro-optical layer 80 in an inclined manner. Consequently, the liquid crystal molecules form a predetermined angle with the substrate body 19 and the substrate body 29. In this way, the electro-optical device 1 is constituted as a liquid crystal device of a vertical alignment (VA) mode.

In the first substrate 10, in a region overlapping a corner portion of the substrate body 29 on an outer side of the seal material 107, an inter-substrate conduction electrode 109 for establishing electrical conduction between the first substrate 10 and the second substrate 20 is formed. In the inter-substrate conduction electrode 109, an inter-substrate conduction material 109a containing conductive particles is disposed. The common electrode 21 of the second substrate 20 is electrically coupled to the first substrate 10 side via the inter-substrate conduction material 109a and the inter-substrate conduction electrode 109. Consequently, a common potential is applied to the common electrode 21 from the first substrate 10 side.

In the electro-optical device 1 of the present embodiment, the pixel electrodes 9a and the common electrode 21 are formed of an ITO film, and the electro-optical device 1 is constituted as a transmissive liquid crystal device. In such an electro-optical device 1, of the first substrate 10 and the second substrate 20, light incident on the electro-optical layer 80 from one of the substrates is modulated, while being transmitted through and emitted from the other of the substrates, to display an image. In the present embodiment, as indicated by an arrow L, light incident from the second substrate 20 is modulated pixel by pixel by the electro-optical layer 80, while being transmitted through and emitted from the first substrate 10, to display an image.

Electrical Configuration of Electro-optical Device 1

Figure 3:
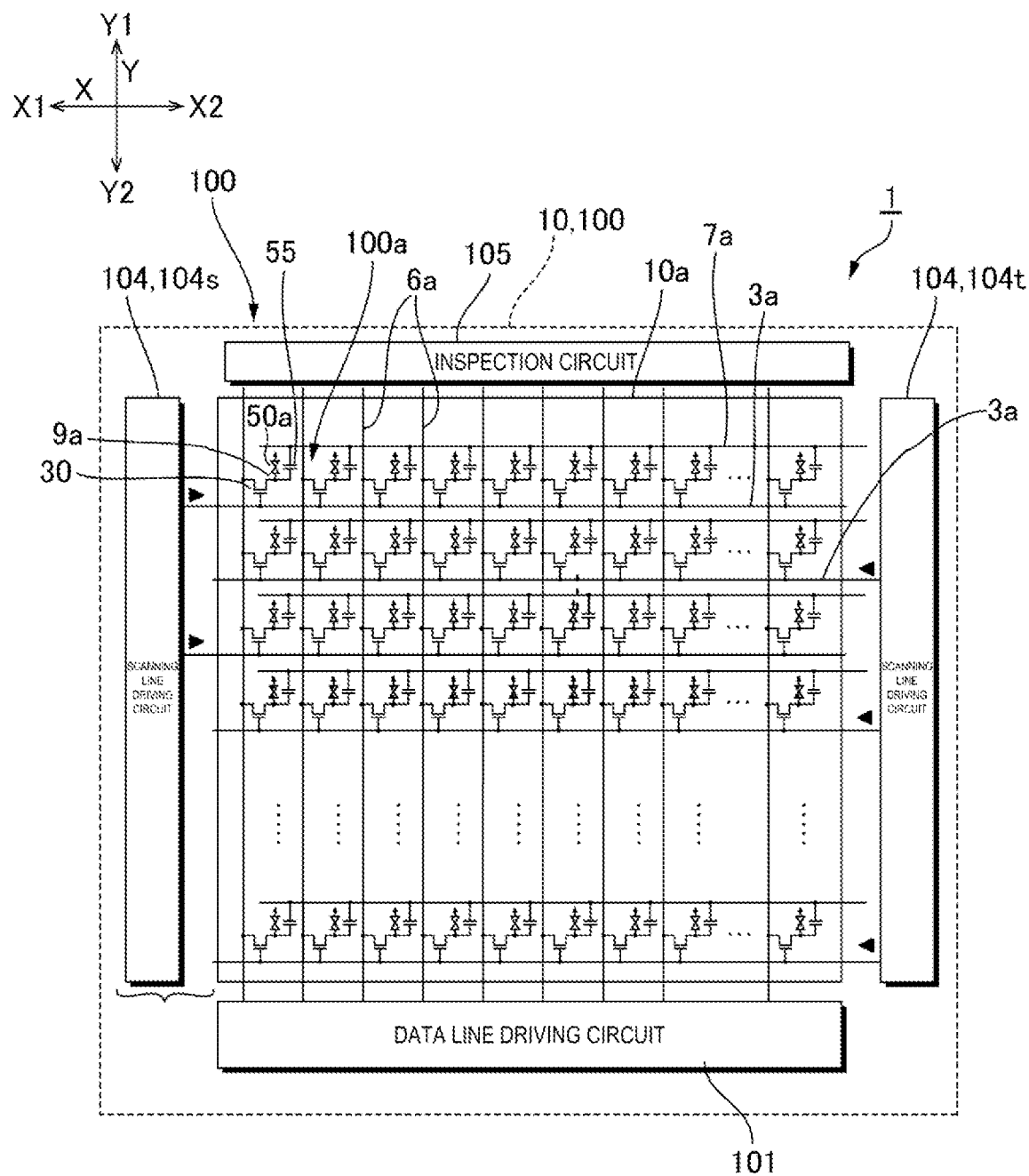
FIG. 3 is a block diagram illustrating an electrical configuration of the electro-optical device illustrated in FIG. 1.

FIG. 3 is a block diagram illustrating an electrical configuration of the electro-optical device 1 illustrated in FIG. 1. In FIG. 3, the electro-optical device 1 includes a liquid crystal panel 100 of a VA mode. The liquid crystal panel 100 includes, in a central region thereof, the display region 10a in which a plurality of pixels 100a are arranged in a matrix pattern. In the liquid crystal panel 100, in the first substrate 10 described above with reference to FIGS. 1, 2, and the like, a plurality of scanning lines 3a extending in the X-axis direction and a plurality of data lines 6a extending in the Y-axis direction are formed on the inner side of the display region 10a. The plurality of pixels 100a are formed corresponding to the respective intersections between the plurality of scanning lines 3a and the plurality of data lines 6a. The plurality of scanning lines 3a are electrically coupled to the scanning line driving circuits 104, while the plurality of data lines 6a are coupled to the data line driving circuit 101.

Furthermore, an inspection circuit 105 is electrically coupled to the plurality of data lines 6a on the opposite side in the Y-axis direction from the data line driving circuit 101.

In each of the plurality of pixels 100a, a transistor 30 for pixel switching including a field effect transistor or the like, and the pixel electrode 9a electrically coupled to the transistor 30 are formed. The data line 6a is electrically coupled to one source/drain region of the transistor 30. The scanning line 3a is electrically coupled to the gate of the transistor 30. The pixel electrode 9a is electrically coupled to the other source/drain region of the transistor 30. An image signal is supplied to the data line 6a, while a scanning signal is supplied to the scanning line 3a. In the present embodiment, the scanning line driving circuits 104 are formed as a scanning line driving circuit 104s on a first side X1 in the X-axis direction of the display region 10a, and a scanning line driving circuit 104t on a second side X2 in the X-axis direction of the display region 10a. The scanning line driving circuit 104s on the first side X1 in the X-axis direction drives odd-numbered scanning lines 3a, while the scanning line driving circuit 104t on the second side X2 in the X-axis direction drives even-numbered scanning lines 3a.

In each of the pixels 100a, the pixel electrode 9a faces the common electrode 21 described above with reference to FIGS. 1 and 2 with the electro-optical layer 80 disposed therebetween, and constitutes a liquid crystal capacitor 50a. In each of the pixels 100a, a capacitance element 55 is added in parallel with the liquid crystal capacitor 50a to prevent fluctuation of the image signal held by the liquid crystal capacitor 50a. In the present embodiment, to constitute the capacitance elements 55, capacitance lines 7a extending across the plurality of pixels 100a are formed in the substrate body 19, and the common potential is supplied to the capacitance lines 7a. In FIG. 3, one capacitance line 7a is illustrated extending in the X-axis direction. However, in some cases, a configuration may be employed in which the capacitance lines 7a extend in the Y-axis direction, and a configuration may also be employed in which the capacitance lines 7a extend in both the X-axis direction and the Y-axis direction.

Schematic Configuration of Pixel 100a

Figure 4:
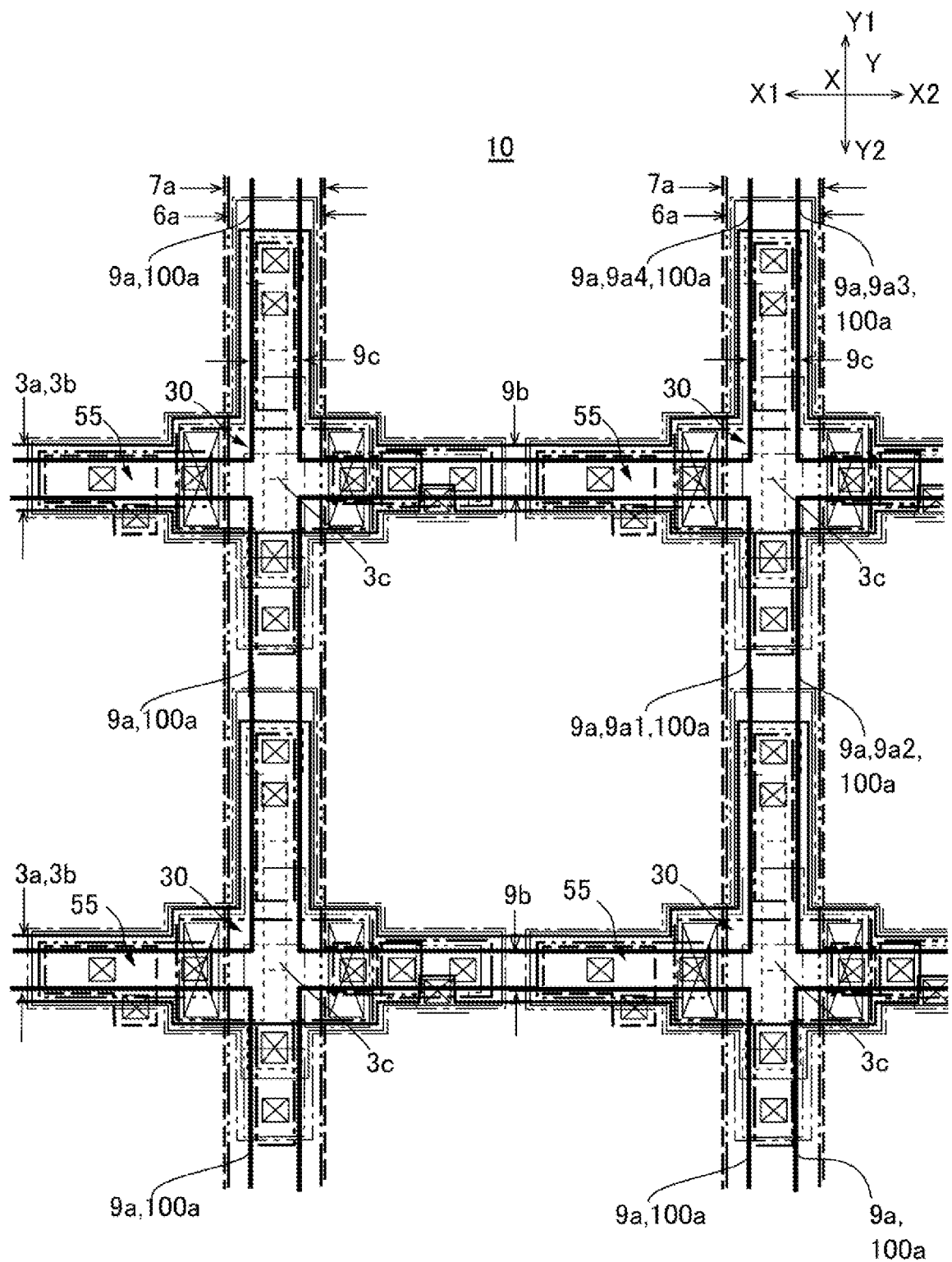
FIG. 4 is a plan view of a plurality of adjacent pixels in the electro-optical device illustrated in FIG. 1.
Figure 5:
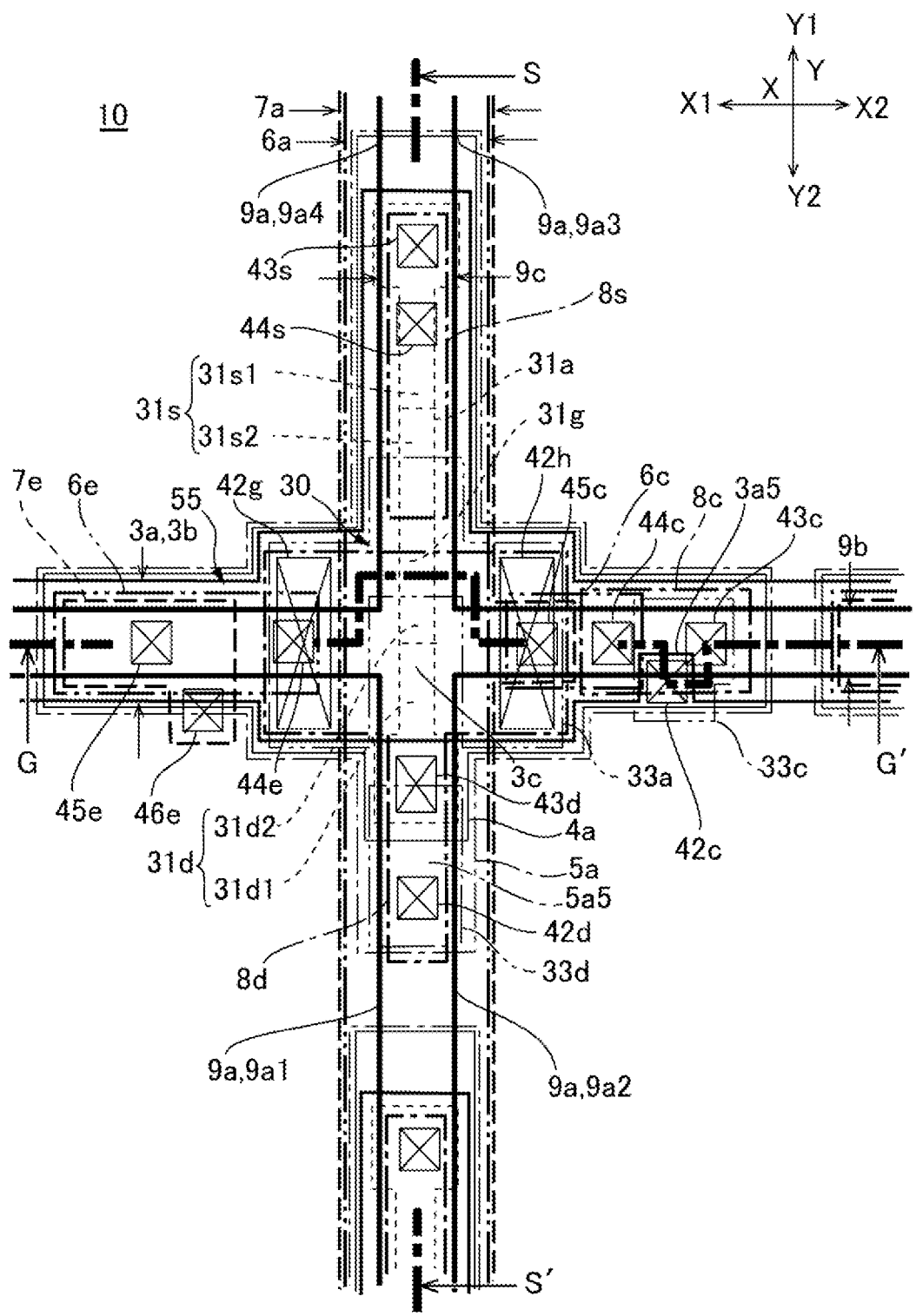
FIG. 5 is an enlarged plan view illustrating a vicinity of a transistor illustrated in FIG. 4.
Figure 6:
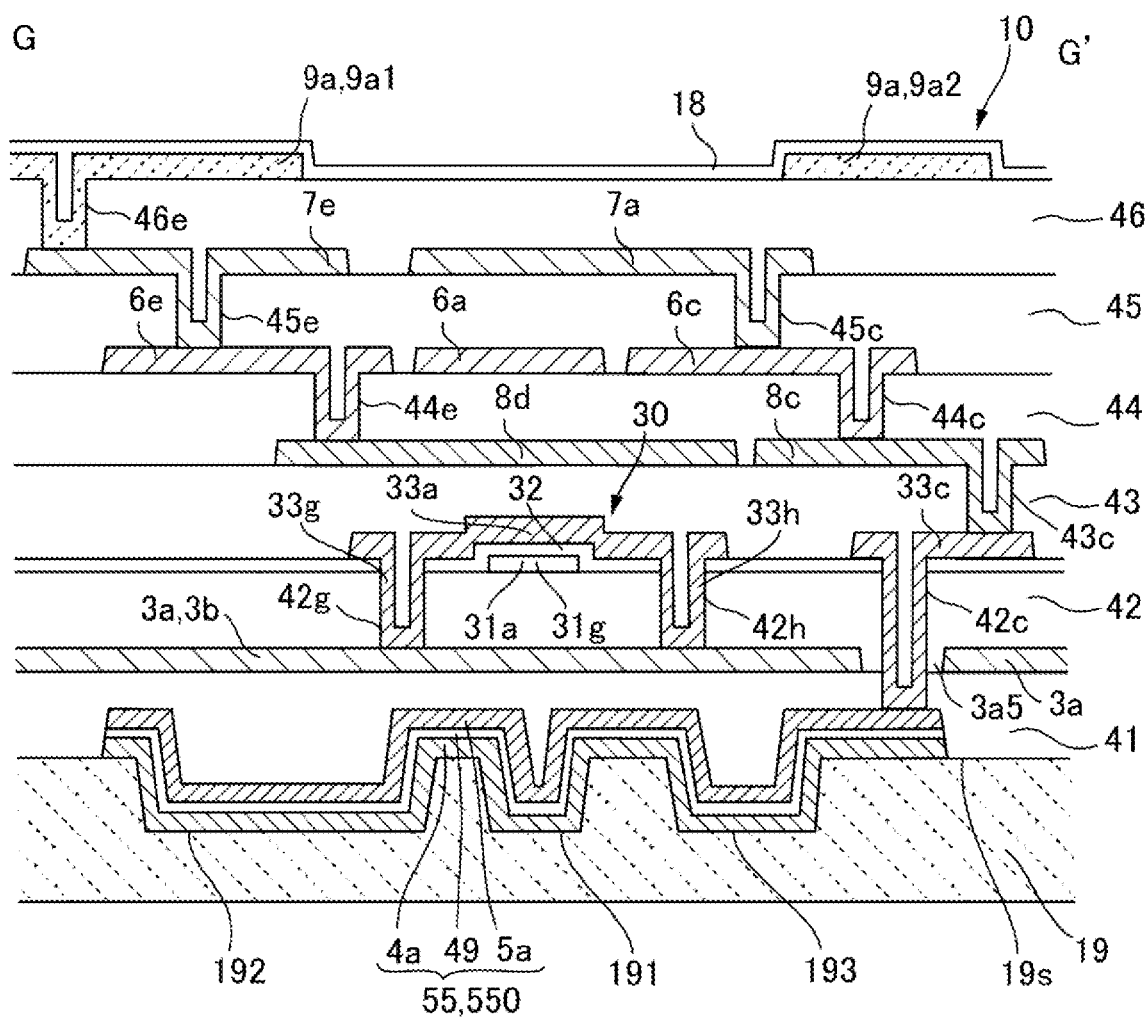
FIG. 6 is a cross-sectional view taken along a line G-G' in the vicinity of the transistor illustrated in FIG. 5.
Figure 7:
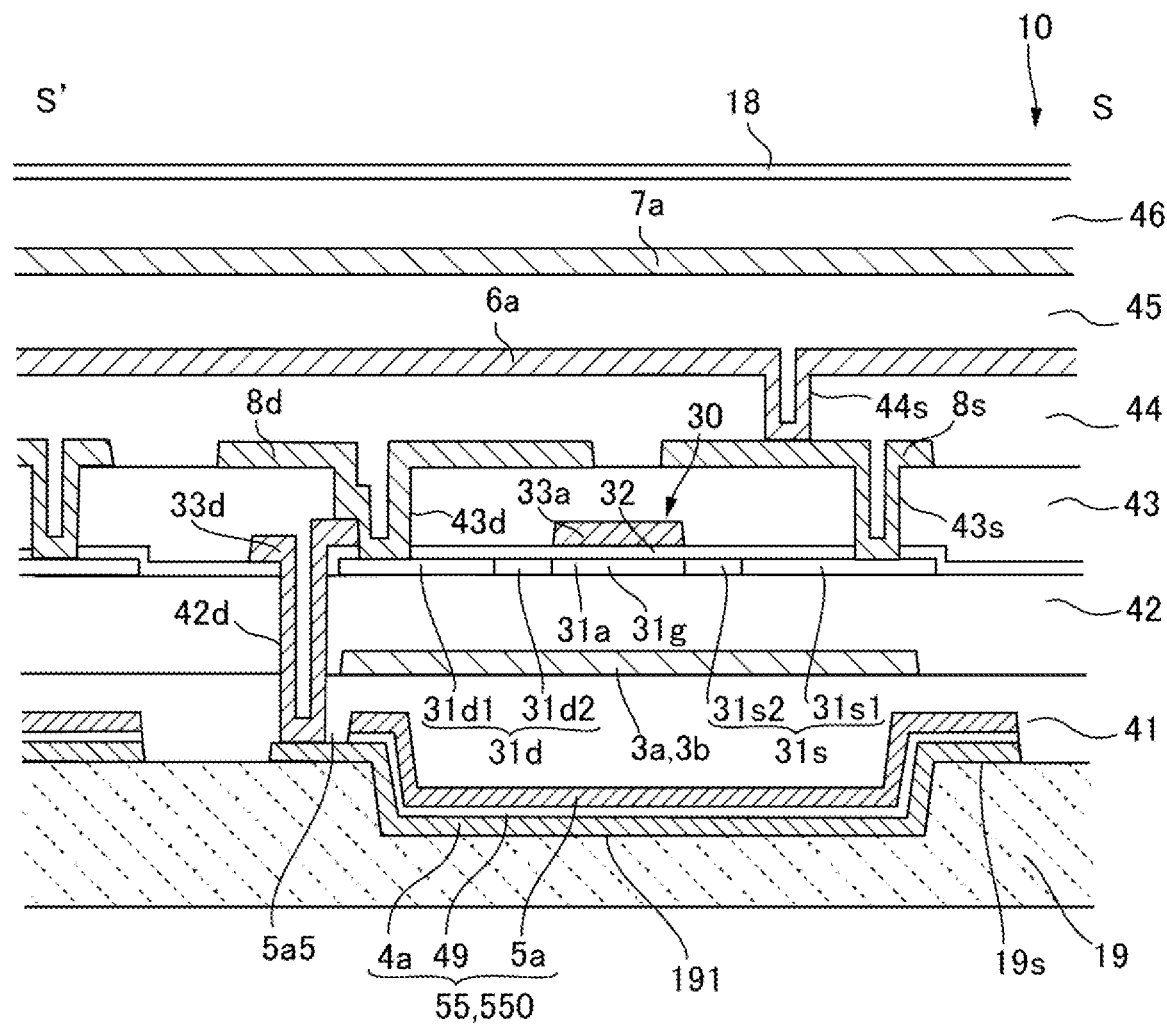
FIG. 7 is a cross-sectional view taken along a line S-S' in the vicinity of the transistor illustrated in FIG. 5.

FIG. 4 is a plan view of the plurality of adjacent pixels 100a in the electro-optical device 1 illustrated in FIG. 1. FIG. 5 is an enlarged plan view illustrating a vicinity of the transistor 30 illustrated in FIG. 4. FIG. 6 is a cross-sectional view taken along a line G-G' in the vicinity of the transistor 30 illustrated in FIG. 5. FIG. 6 schematically illustrates a state in which the transistor 30 and the like are cut along the scanning line 3a. FIG. 7 is a cross-sectional view taken along a line S-S' in the vicinity of the transistor 30 illustrated in FIG. 5. FIG. 7 schematically illustrates a state in which the transistor 30 and the like are cut along the data line 6a. Note that in FIGS. 4 and 5 and FIGS. 8 to 11 to be described later, layers are indicated by the lines below. Furthermore, in FIGS. 4 and 5 and FIGS. 8 to 11 to be described later, for layers of which ends overlap each other in plan view, the positions of the ends are shifted so that the shapes and the like of the layers are easily recognizable.

Scanning line 3a: a thick solid line
Semiconductor film 31a: a thin and short broken line
Gate electrode 33a: a thin two-dot-dash line
First capacitor electrode 4a: a thin dot-dash line
Second capacitor electrode 5a: a thin solid line
Relay electrodes 8c, 8d, and 8s: a thick dot-dash line
Data line 6a and relay electrodes 6c and 6d: a thin two-dot-dash line Capacitance line 7a and relay electrode 7d: a thick and long broken line
Pixel electrode 9a: a very thick solid line As illustrated in FIGS. 4 and 5, in the first substrate 10, the pixel electrode 9a is formed in each of the plurality of pixels 100a. The scanning lines 3a, the data lines 6a, and the capacitance lines 7a extend along inter-pixel regions sandwiched between adjacent pixel electrodes 9a. More specifically, the scanning line 3a extends in the X-axis direction overlapping a first inter-pixel region 9b extending in the X-axis direction, while the data line 6a and the capacitance line 7a extend in the Y-axis direction overlapping a second inter-pixel region 9c extending in the Y-axis direction. In the first substrate 10, transistors 30 including semiconductor films 31a that correspond to intersections 3c between data lines 6a and scanning lines 3a are formed. The scanning lines 3a, the data lines 6a, and the capacitance lines 7a have light-shielding properties. Accordingly, a region in which the scanning line 3a, the data line 6a, the capacitance line 7a, and a conductive film in the same layer as these lines are formed is a light-shielding region through which light does not pass, while a region surrounded by light-shielding regions is an aperture region through which light is transmitted.

As illustrated in FIGS. 6 and 7, in the first substrate 10, on the first surface 19s side of the substrate body 19, a first insulating film 41, a second insulating film 42, and interlayer insulating films 43 to 46 are sequentially formed. For example, the surfaces of the first insulating film 41, the second insulating film 42, and the interlayer insulating film 46 are formed into a continuous flat surface by chemical-mechanical polishing (CMP) or the like. The first insulating film 41 and the second insulating film 42 are interlayer insulating films. A capacitance element 55, the scanning line 3a serving as a light-shielding film 3b, the semiconductor film 31a of the transistor 30, a gate electrode 33a of the transistor 30, the data line 6a, and the capacitance line 7a are sequentially provided in a layer between the substrate body 19 and the pixel electrodes 9a.

Detailed Description of Each Layer

Figure 8:
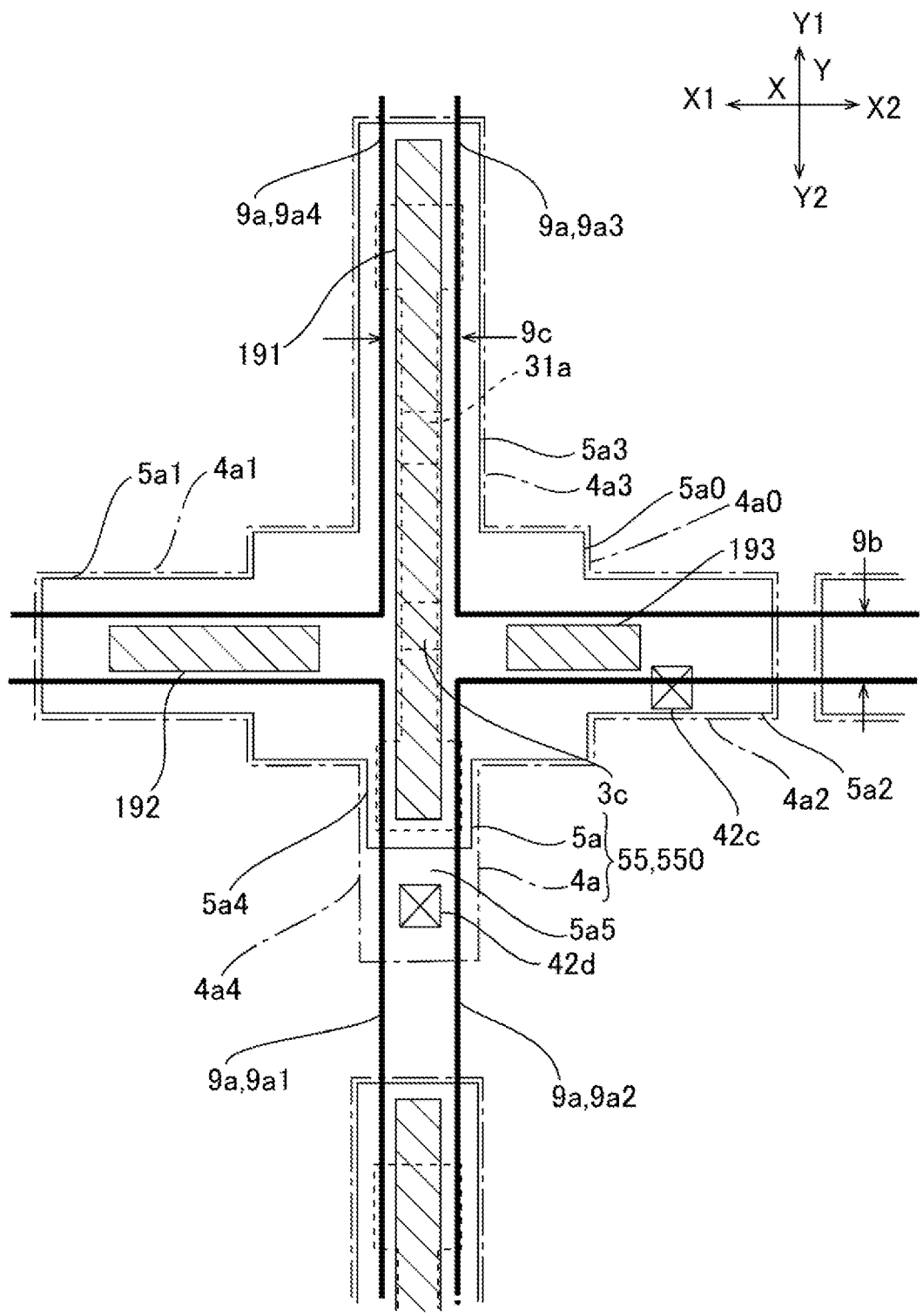
FIG. 8 is a plan view of a capacitance element illustrated in FIG. 5.
Figure 9:
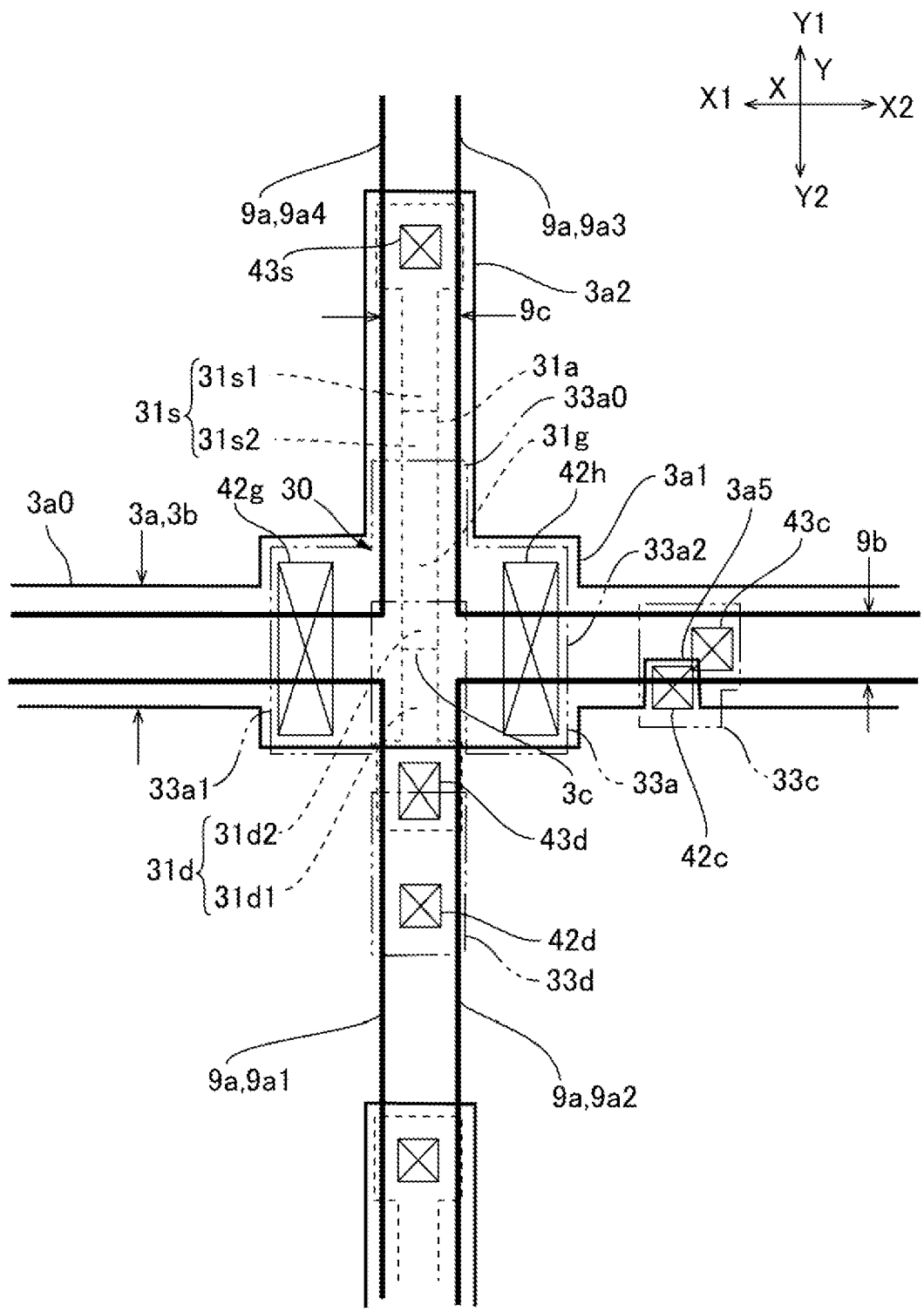
FIG. 9 is a plan view of the transistor illustrated in FIG. 5.
Figure 10:
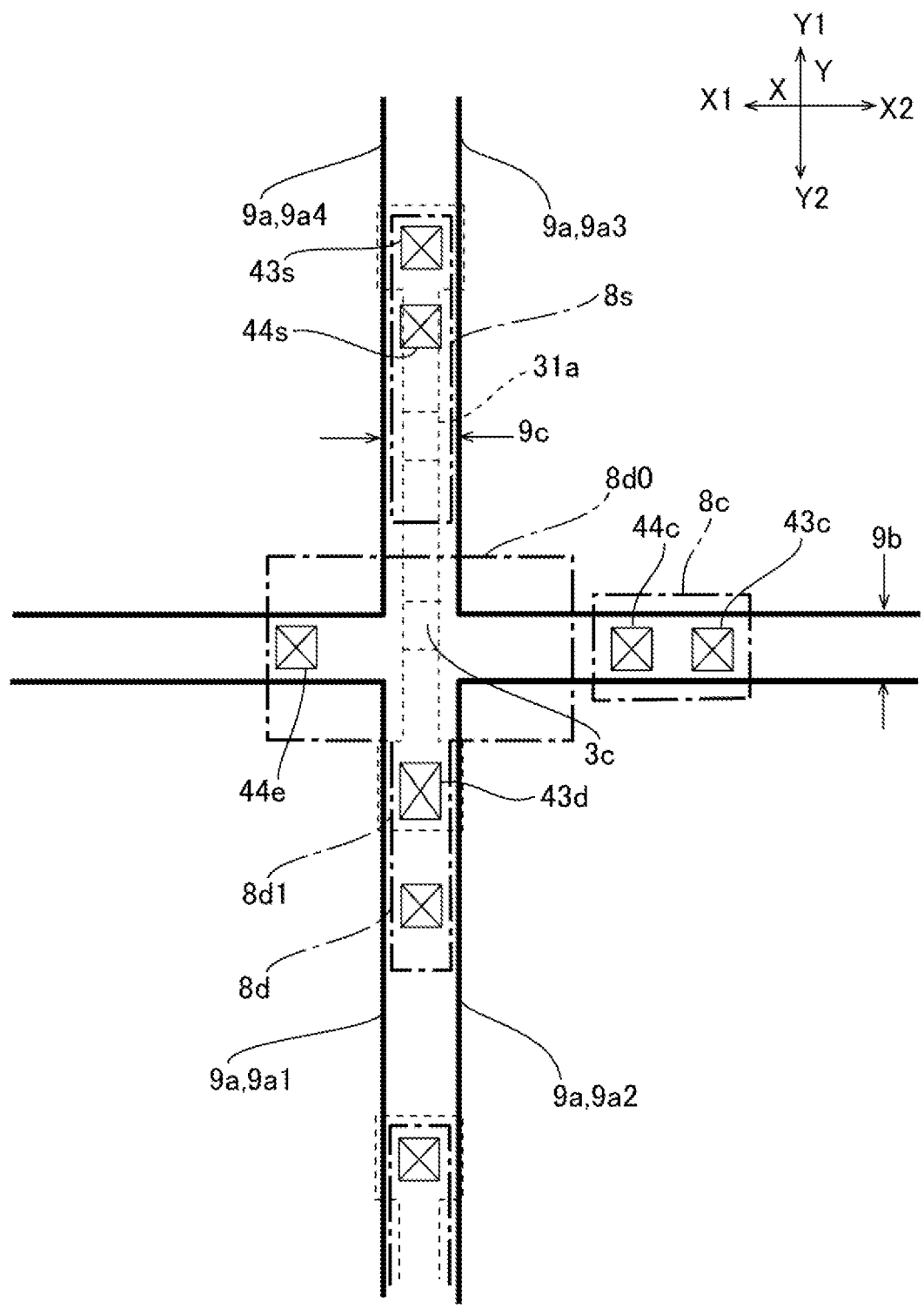
FIG. 10 is a plan view of relay electrodes illustrated in FIG. 5.
Figure 11:
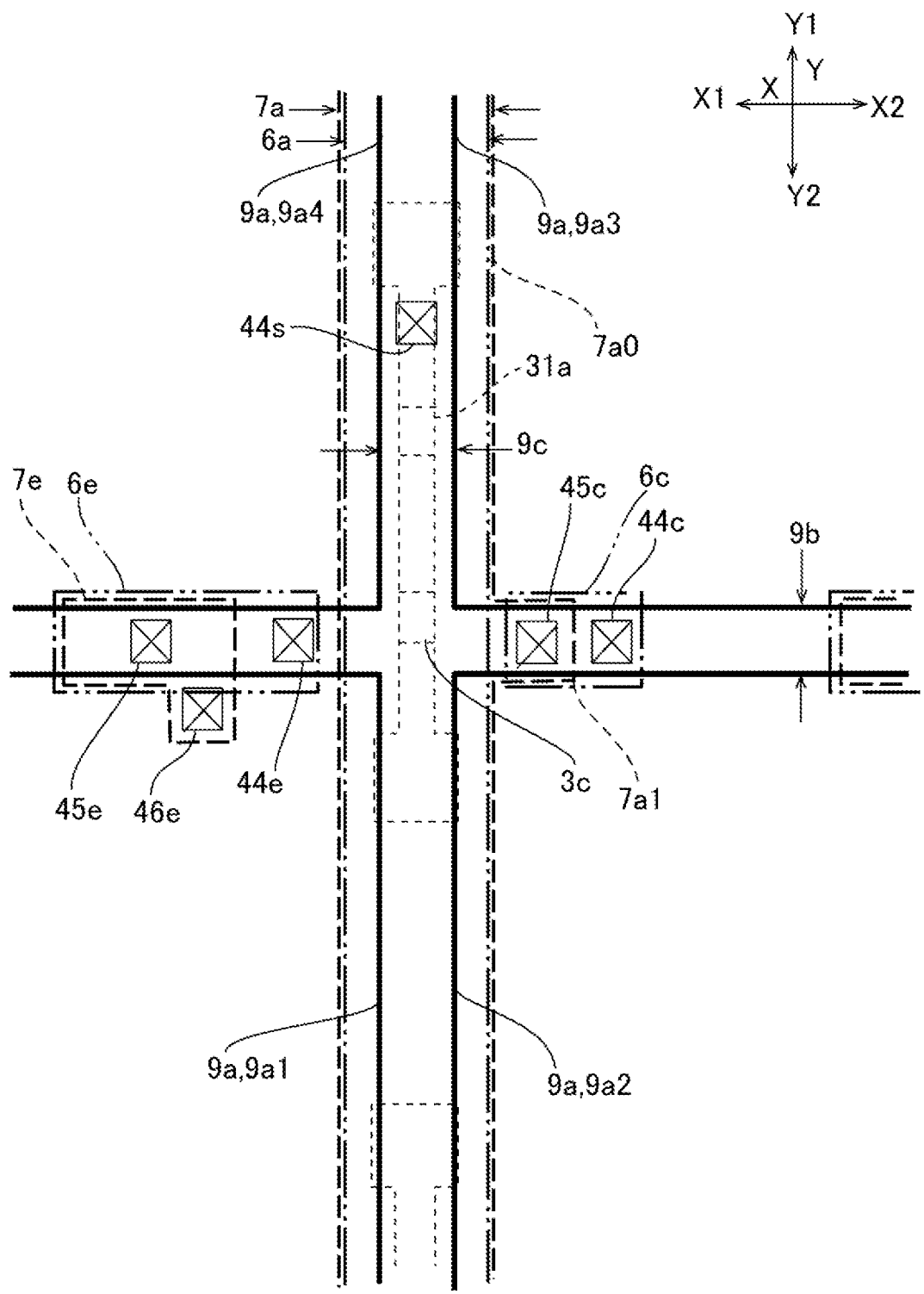
FIG. 11 is a plan view of a data line and a capacitance line illustrated in FIG. 5.

A detailed configuration of the first substrate 10 will be described with reference to FIGS. 5, 6, and 7, as well as with reference to FIGS. 8 to 11 described below as necessary. FIG. 8 is a plan view of the capacitance element 55 illustrated in FIG. 5. FIG. 9 is a plan view of the transistor 30 illustrated in FIG. 5. FIG. 10 is a plan view of the relay electrodes 8c, 8d, and 8s illustrated in FIG. 5. FIG. 11 is a plan view of the data line 6a and the capacitance line 7a illustrated in FIG. 5. Note that FIGS. 8, 9, 10, and 11 each illustrate contact holes related to the electrical coupling of the electrodes and the like illustrated in these drawings, and illustrate the semiconductor film 31a and pixel electrodes 9a to indicate a position serving as a reference.

As illustrated in FIGS. 5, 6, 7, and 8, between the substrate body 19 and the first insulating film 41, a layered film 550 is provided in which a first conductive film 4a, a dielectric film 49, and a second conductive film 5a are sequentially layered from the substrate body 19 side. The layered film 550 is covered with the first insulating film 41. In the present embodiment, the layered film 550 constitutes the capacitance element 55. The dielectric film 49 is formed of a silicon nitride film, a silicon oxide film, or the like. For example, when the dielectric film 49 is a silicon nitride film, the dielectric film 49 is formed to have a film thickness of 0.01 to 0.03 μm.

The first conductive film 4*a* includes a quadrangular body portion 4*a*0 overlapping the intersection 3*c* between the scanning line 3*a* and the data line 6*a* in plan view, a first protrusion 4*a*1 protruding from the body portion 4*a*0 to the first side X1 in the X-axis direction, and a second protrusion 4*a*2 protruding from the body portion 4*a*0 to the second side X2 in the X-axis direction. Furthermore, the first conductive film 4*a* includes a third protrusion 4*a*3 protruding from the body portion 4*a*0 to a first side Y1 in the Y-axis direction, and a fourth protrusion 4*a*4 protruding from the body portion 4*a*0 to a second side Y2 in the Y-axis direction. The first conductive film 4*a* is formed of a conductive silicon film, a metal silicide film, a metal film, a metal compound film, or the like. For example, when the first conductive film 4*a* is a conductive silicon film, the first conductive film 4*a* is formed to have a film thickness of 0.03 to 0.2 µm.

The second conductive film 5*a* overlaps the first conductive film 4*a* with the dielectric film 49 disposed therebetween from the pixel electrode 9*a* side in plan view. More specifically, the second conductive film 5*a* includes a body portion 5*a*0 overlapping the body portion 4*a*0 in plan view, a first protrusion 5*a*1 overlapping the first protrusion 4*a*1 in plan view, a second protrusion 5*a*2 overlapping the second protrusion 4*a*2 in plan view, a third protrusion 5*a*3 overlapping the third protrusion 4*a*3 in plan view, and a fourth protrusion 5*a*4 overlapping the fourth protrusion 4*a*4 in plan view. The second conductive film 5*a* is formed of a conductive silicon film, a metal silicide film, a metal film, a metal compound film, or the like. For example, when the second conductive film 5*a* is a conductive silicon film, the second conductive film 5*a* is formed to have a film thickness of 0.03 to 0.2 µm.

The first conductive film 4*a*, the dielectric film 49, and the second conductive film 5*a* are collectively patterned portions. Accordingly, the first conductive film 4*a*, the dielectric film 49, and the second conductive film 5*a* have the same shape. However, a notch 5*a*5 is formed in the dielectric film 49 and the second conductive film 5*a* so as to expose an end of the fourth protrusion 4*a*4 of the first conductive film 4*a*.

Note that a first groove 191 and second grooves 192 and 193 are formed in a layer between the substrate body 19 and the capacitance element 55. Configurations and the like of the first groove 191 and the second grooves 192 and 193 will be described later.

As illustrated in FIGS. 5, 6, 7, and 9, in a layer between the first insulating film 41 and the second insulating film 42, the scanning line 3*a* extending in the X-axis direction is formed so as to overlap the first inter-pixel region 9*b*. The scanning line 3*a* includes a wiring portion 3*a*0 extending with a constant width in the X-axis direction, a wide portion 3*a*1 protruding from the wiring portion 3*a*0 to both sides in the Y-axis direction at the intersection 3*c*, and a protrusion 3*a*2 further protruding from the wide portion 3*a*1 to the first side Y1 in the Y-axis direction. For example, the width of the wiring portion 3*a*0 is 0.5 to 1 µm.

The scanning line 3*a* is a conductive light-shielding film 3*b* formed of a metal silicide film, a metal film, a metal compound film, or the like. In the present embodiment, the scanning line 3*a* is formed of a tungsten silicide film. For example, when the scanning line 3*a* is a tungsten silicide film, the scanning line 3*a* is formed to have a film thickness of 0.1 to 0.4 µm.

Between the second insulating film 42 and the interlayer insulating film 43, the transistor 30 for pixel switching is formed. The transistor 30 includes the semiconductor film 31*a* formed at a surface on the pixel electrode 9*a* side of the second insulating film 42, a gate insulating film 32 covering the semiconductor film 31*a* from the pixel electrode 9*a* side, and the gate electrode 33*a* overlapping the semiconductor film 31*a* with the gate insulating layer 32 disposed therebetween in plan view. Accordingly, the second insulating film 42 is provided between the light-shielding film 3*b* and the semiconductor film 31*a*.

The gate electrode 33*a* includes a body portion 33*a*0 overlapping the semiconductor film 31*a*, and protrusions 33*a*1 and 33*a*2 protruding from both ends in the X-axis direction of the body portion 33*a*0 to the second side Y2 in the Y-axis direction. The gate electrode 33*a* includes a conductive film having light-shielding properties such as a metal silicide film, a metal film, and a metal compound film. In the present embodiment, the gate electrode 33*a* is formed of a layered film including a conductive polysilicon film and a metal film of aluminum or the like.

The semiconductor film 31*a* extends in the Y-axis direction so as to overlap the second inter-pixel region 9*c*. The semiconductor film 31*a* includes a channel region 31*g* overlapping the gate electrode 33*a* in plan view, a first source/drain region 31*s* adjacent to the channel region 31*g* on the first side Y1 in the Y-axis direction, and a second source/drain region 31*d* adjacent to the channel region 31*g* on the second side Y2 in the Y-axis direction. The transistor 30 has a lightly doped drain (LDD) structure. Accordingly, the second source/drain region 31*d* includes a high concentration region 31*d*1 in which impurities are introduced at a high concentration at a position spaced apart from the channel region 31*g*, and a low concentration region 31*d*2 in which impurities are introduced at a lower concentration than that of the high concentration region 31*d*1 between the channel region 31*g* and the high concentration region 31*d*1. The first source/drain region 31*s* includes a high concentration region 31*s*1 in which impurities are introduced at a high concentration at a position spaced apart from the channel region 31*g*, and a low concentration region 31*s*2 in which impurities are introduced at a lower concentration than that of the high concentration region 31*s*1 between the channel region 31*g* and the high concentration region 31*s*1. The width in the X-axis direction of the semiconductor film 31*a* is 0.3 µm, for example, and linearly extends in the Y-axis direction.

The semiconductor film 31*a* is constituted by a polysilicon film or the like. The gate insulating film 32 has a two-layer structure including a first gate insulating film formed of a silicon oxide film obtained by thermal oxidization of the semiconductor film 31*a*, and a second gate insulating film formed of a silicon oxide film formed by a low-pressure chemical vapor deposition (CVD) method or the like.

The wide portion 3*a*1 of the scanning line 3*a* overlaps the gate electrode 33*a*, the first source/drain region 31*s*, the channel region 31*g*, and the second source/drain region 31*d* in plan view. Furthermore, the wide portion 3*a*1 of the scanning line 3*a* and the protrusions 33*a*1 and 33*a*2 of the gate electrode 33*a* are electrically coupled to the scanning line 3*a* via groove-shaped contact holes 42*g* and 42*h* penetrating the gate insulating film 32 and the second insulating film 42.

Between the gate insulating film 32 and the interlayer insulating film 43, a relay electrode 33*c* spaced apart from the gate electrode 33*a* to the second side X2 in the X-axis direction, and a relay electrode 33*d* spaced apart from the gate electrode 33*a* to the second side Y2 in the Y-axis direction are provided. The relay electrodes 33*c* and 33*d* are formed of the same conductive film as that of the gate electrode 33*a*.

At an end on the second side Y2 in the Y-axis direction of the wiring portion 3a0 of the scanning line 3a, a notch 3a5 is formed in a region overlapping the relay electrode 33c and the second conductive film 5a in plan view. In the gate insulating film 32, the second insulating film 42, and the first insulating film 41, a contact hole 42c is formed that passes through the notch 3a5 to reach the second conductive film 5a. Accordingly, the relay electrode 33c is electrically coupled to the second conductive film 5a via the contact hole 42c.

In the gate insulating film 32, the second insulating film 42, and the first insulating film 41, a contact hole 42d is formed that passes through the notch 5a5 to reach the first conductive film 4a. Accordingly, the relay electrode 33d is electrically coupled to the first conductive film 4a via the contact hole 42d.

As illustrated in FIGS. 5, 6, 7, and 10, between the interlayer insulating film 43 and the interlayer insulating film 44, a relay electrode 8s overlapping the first source/drain region 31s in plan view, a relay electrode 8d overlapping the second source/drain region 31d in plan view, and a relay electrode 8c overlapping the relay electrode 33c in plan view are formed spaced apart from each other. The relay electrodes 8c, 8d, and 8s are formed of a conductive film having light-shielding properties such as a metal silicide film, a metal film, and a metal compound film.

The relay electrode 8d includes a body portion 8d0 overlapping the gate electrode 33a in plan view, and a protrusion 8d1 protruding from the body portion 8d0 so as to overlap the second source/drain region 31d in plan view. The protrusion 8d1 is electrically coupled to the second source/drain region 31d via a contact hole 43d penetrating the interlayer insulating film 43 and the gate insulating film 32. Furthermore, since an end of the relay electrode 33d is exposed in the contact hole 43d, the protrusion 8d1 is electrically coupled to the relay electrode 33d.

The relay electrode 8s is electrically coupled to the first source/drain region 31s via a contact hole 43s penetrating the interlayer insulating film 43 and the gate insulating film 32. The relay electrode 8c is electrically coupled to the relay electrode 33c via a contact hole 43c penetrating the interlayer insulating film 43.

As illustrated in FIGS. 5, 6, 7, and 11, between the interlayer insulating film 44 and the interlayer insulating film 45, the data line 6a extending in the Y-axis direction so as to overlap the second inter-pixel region 9c in plan view, a relay electrode 6e spaced apart from the data line 6a to the first side X1 in the X-axis direction, and a relay electrode 6c spaced apart from the data line 6a to the second side X2 in the X-axis direction are provided. The data line 6a and the relay electrodes 6c and 6e are formed of a conductive film having light-shielding properties such as a metal silicide film, a metal film, and a metal compound film. For example, the width of the data line 6a is 0.5 to 1 µm.

The data line 6a is electrically coupled to the relay electrode 8s via a contact hole 44s penetrating the interlayer insulating film 44. Accordingly, the data line 6a is electrically coupled to the first source/drain region 31s via the relay electrode 8s. The relay electrode 6e is electrically coupled to the relay electrode 8d via a contact hole 44e penetrating the interlayer insulating film 44. The relay electrode 6c is electrically coupled to the relay electrode 8c via a contact hole 44c penetrating the interlayer insulating film 44.

Between the interlayer insulating film 45 and the interlayer insulating film 46, the capacitance line 7a extending in the Y-axis direction so as to overlap the data line 6a in plan view, and a relay electrode 7e spaced apart from the capacitance line 7a to the first side X1 in the X-axis direction are provided. The capacitance line 7a and the relay electrode 7e are formed of a conductive film having light-shielding properties such as a metal silicide film, a metal film, and a metal compound film.

The capacitance line 7a includes a wiring portion 7a0 extending in the Y-axis direction, and a protrusion 7a1 protruding from a portion overlapping the intersection 3c of the wiring portion 7a0 to the second side X2 in the X-axis direction. The protrusion 7a1 is electrically coupled to the relay electrode 6c via a contact hole 45c penetrating the interlayer insulating film 45. Accordingly, the capacitance line 7a is electrically coupled to the second conductive film 5a of the capacitance element 55 via the relay electrode 6c, the relay electrode 8c, and the relay electrode 33c. The width of the wiring portion 7a0 is 0.5 to 1 µm.

The relay electrode 7e is electrically coupled to the relay electrode 6e via a contact hole 45e penetrating the interlayer insulating film 45. Furthermore, the pixel electrode 9a is electrically coupled to the relay electrode 7e via a contact hole 46e penetrating the interlayer insulating film 46. In the present embodiment, of four pixel electrodes 9a1, 9a2, 9a3, and 9a4 adjacent to each other around the contact hole 46e, the pixel electrode 9a1 located on the second side Y2 in the Y-axis direction of the contact hole 46e is electrically coupled to the relay electrode 7e via the contact hole 46e.

As a result, the pixel electrode 9a is electrically coupled to the second source/drain region 31d via the relay electrode 7e, the relay electrode 6e, and the relay electrode 8d. Accordingly, when the transistor 30 is brought into the on state, an image signal is supplied from the data line 6a to the pixel electrode 9a. Furthermore, the pixel electrode 9a is electrically coupled to the first conductive film 4a of the capacitance element 55 via the relay electrode 7e, the relay electrode 6e, the relay electrode 8d, and the relay electrode 33d.

In the electro-optical device 1 configured in this way, on the pixel electrode 9a side of the semiconductor film 31a, the capacitance line 7a, the data line 6a, and the relay electrode 8d overlap the semiconductor film 31a in plan view. Accordingly, light incident from the pixel electrode 9a side is less likely to be incident on the channel region 31g and the low concentration region 31d2 of the semiconductor film 31a. Furthermore, on the substrate body 19 side of the semiconductor film 31a, the scanning line 3a overlaps the semiconductor film 31a in plan view. Accordingly, even when return light of the light emitted from the substrate body 19 is incident from the substrate body 19 side, light is less likely to be incident on the channel region 31g and the low concentration region 31d2 of the semiconductor film 31a. Furthermore, of the gate electrode 33a, portions of the gate electrode 33a located within the contact holes 42g and 42h constitute light-shielding walls for the channel region 31g and the low concentration region 31d2 of the semiconductor film 31a. Accordingly, light from the X-axis direction toward the channel region 31g and the low concentration region 31d2 can be blocked by the gate electrode 33a located within the contact holes 42g and 42h. Therefore, according to the present embodiment, degradation in characteristics of the transistor 30 resulting from photocurrent is less likely to occur.

Configurations of First Groove 191 and Second Grooves 192 and 193

Figure 12:
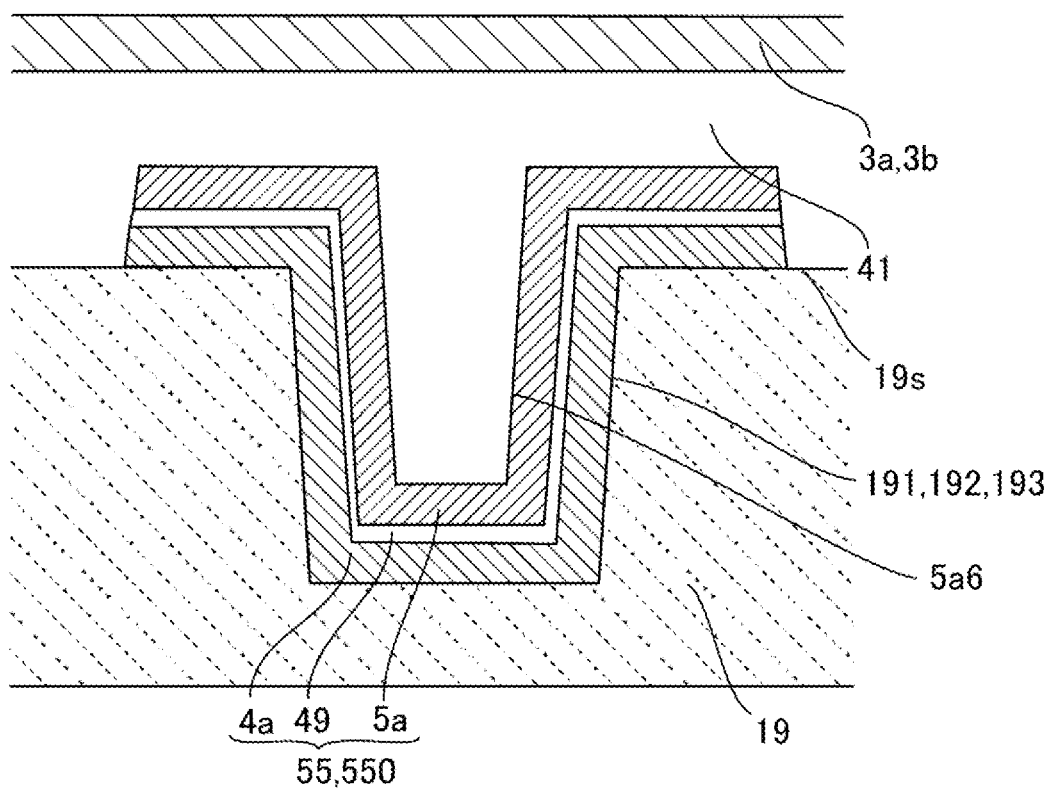
FIG. 12 is a cross-sectional view in a width direction of a first groove and the like illustrated in FIG. 8.
Figure 13:
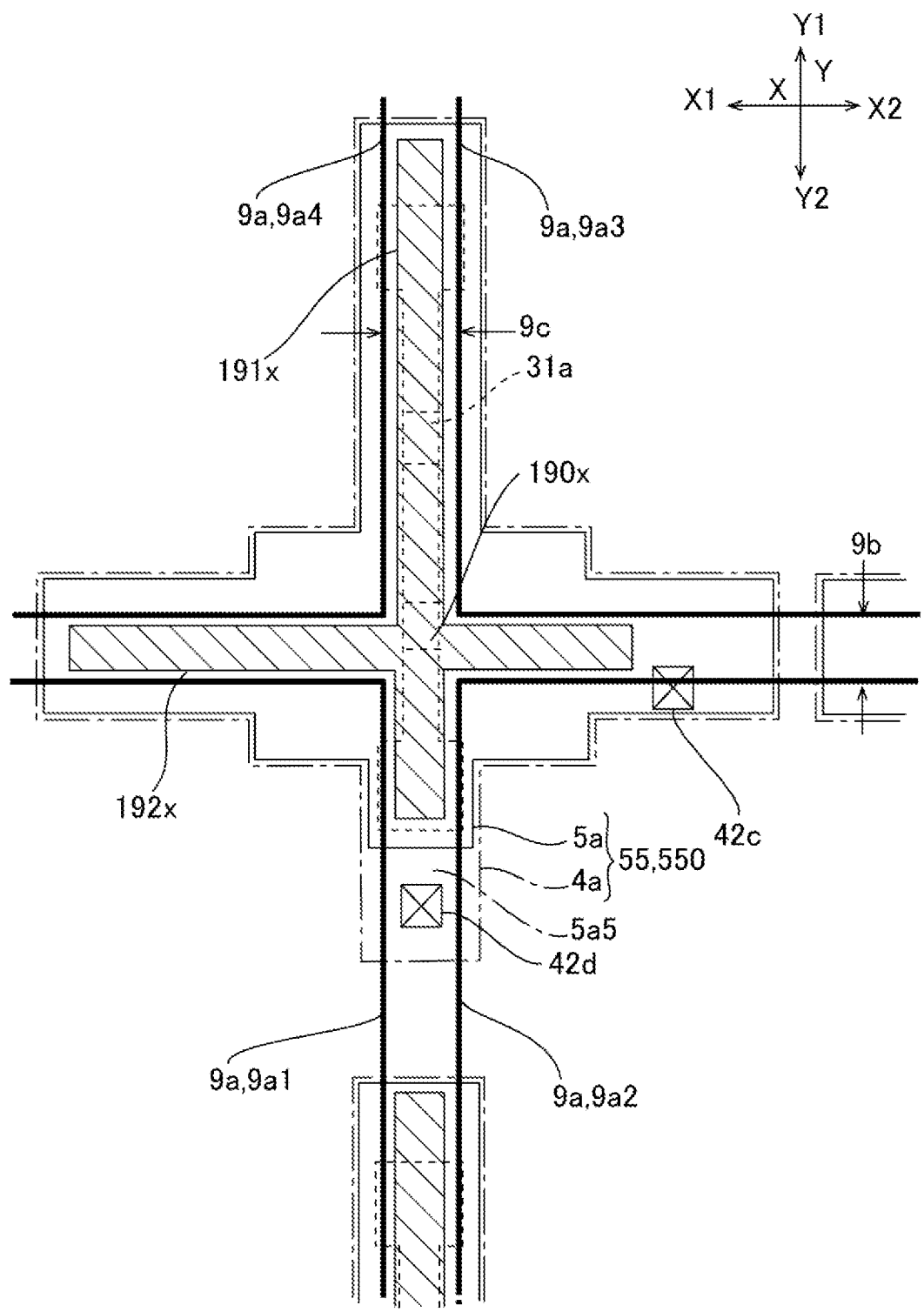
FIG. 13 is a plan view of a first groove and a second groove according to a reference example of the present disclosure.
Figure 14:
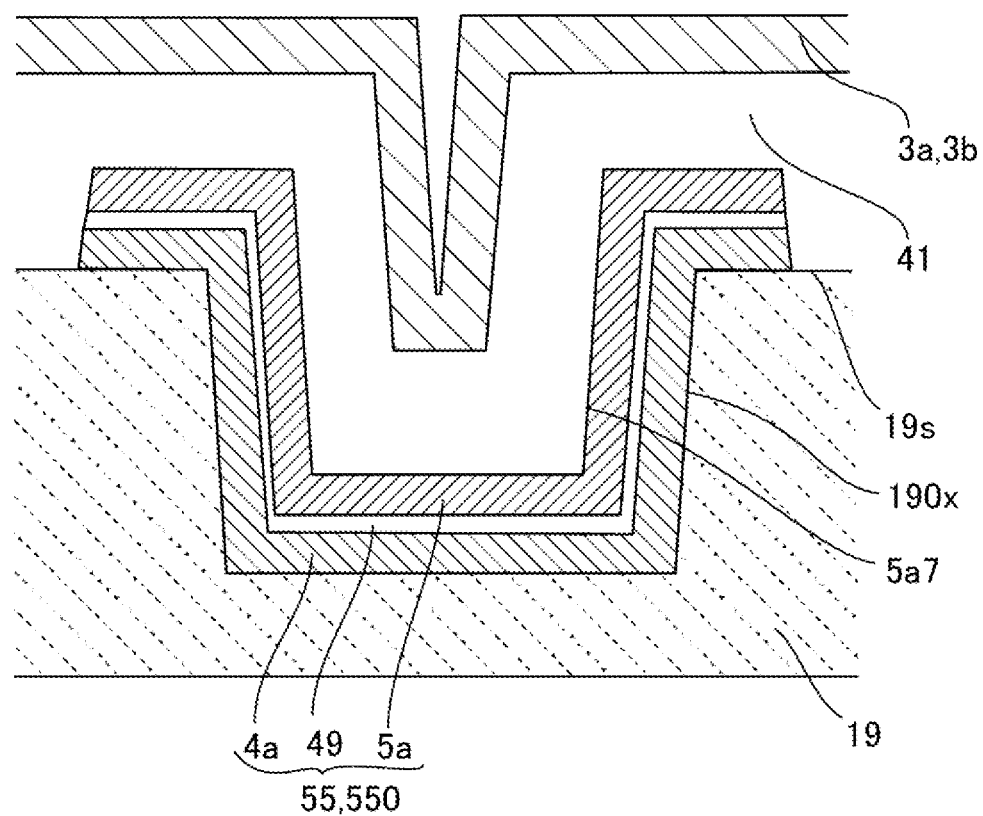
FIG. 14 is a cross-sectional view of an intersection between the first groove and the second groove and the like illustrated in FIG. 13.

FIG. 12 is a cross-sectional view in a width direction of the first groove 191 and the like illustrated in FIG. 8. FIG. 13 is a plan view of a first groove 191x and a second groove 192x according to a reference example of the present disclosure. FIG. 14 is a cross-sectional view of an intersection 190x between the first groove 191x and the second groove 192x and the like illustrated in FIG. 13.

As illustrated in FIGS. 6, 7, and 8, between the substrate body 19 and the pixel electrode 9a, between the substrate body 19 and the capacitance element 55, the first groove 191 depressed to the opposite side from the pixel electrode 9a and extending in one direction of the X-axis direction and the Y-axis direction, and a plurality of second grooves extending in a direction different from the extending direction of the first groove 191 are provided. In other words, the first groove 191 and the plurality of second grooves are depressed toward the substrate body 19 side. In the present embodiment, the first groove 191 and the plurality of second grooves are formed in the surface on the pixel electrode 9a side of the substrate body 19. In the present embodiment, the first groove 191 linearly extends in the Y-axis direction so as to overlap the semiconductor film 31a in plan view. On both sides in the width direction of the first groove 191, a plurality of second grooves 192 and 193 are disposed in the X-axis direction. Here, in the layered film 550, the second conductive film 5a overlaps the sidewalls and the bottom wall of each of the first groove 191 and the second grooves 192 and 193 with the dielectric film 49 and the first conductive film 4a disposed therebetween. Accordingly, the capacitance element 55 has a greater capacitance than when the layered film 550 is formed at a flat surface alone. Furthermore, the depth of depression of the first groove 191 and the second grooves 192 and 193 is deeper than the total film thickness of the layered film 550, and the layered film 550 is uniformly formed by a CVD method or the like, which makes it possible to form stable capacitance.

Furthermore, the second grooves 192 and 193 do not intersect the first groove 191 extending in the Y-axis direction, but extend in the X-axis direction intersecting the first groove 191. More specifically, the second grooves 192 and 193 are provided at positions spaced apart from the first groove 191 in the X-axis direction, and do not intersect the first groove 191. Accordingly, the first groove 191 and the second grooves 192 and 193 have a narrow groove width at any position. Therefore, even when a recess 5a6 resulting from the first groove 191 and the second grooves 192 and 193 is generated in the surface of the second conductive film 5a, portions of the first insulating film 41 deposited on the bottom wall and the sidewalls of the first groove 191 and the second grooves 192 and 193 easily fill the recess 5a6 when the first insulating film 41 is formed. Accordingly, as in the present embodiment, even when chemical-mechanical polishing is performed after the first insulating film 41 is formed, the film thickness need not be thick when the first insulating film 41 is formed, so the film formation time for the first insulating film 41 is shortened. Furthermore, since it is sufficient that the semiconductor film 31a is made flat, it is not necessary to carry out chemical-mechanical polishing to make the surface of the first insulating film 41 flat as long as the recess 5a6 is filled. In the present embodiment, the first insulating film 41 is formed of a silicon oxide film or the like, is formed to have a film thickness of 0.2 to 0.5 µm, and has a shape with a good step coverage with the recess 5a6 being filled. Furthermore, for the first groove 191, the opening width is 0.6 µm to 1.0 µm, the width of the bottom wall is 0.4 µm to 0.8 µm, and the depth is 1 µm to 2 µm.

In contrast, as illustrated in FIGS. 13 and 14, when the first groove 191x and the second groove 192x intersect each other, the groove width in directions diagonally intersecting the first groove 191x and the second groove 192x is widened at the intersection 190x between the first groove 191x and the second groove 192x. Therefore, when a wide recess 5a7 resulting from the intersection 190x between the first groove 191x and the second groove 192x is generated in the surface of the second conductive film 5a, the first insulating film 41 is less likely to fill the recess 5a7 when the first insulating film 41 is formed. As a result, stress applied to the scanning line 3a formed at the surface of the first insulating film 41 can generate cracks. Furthermore, as in the present embodiment, when chemical-mechanical polishing is performed after the first insulating film 41 is formed, the film thickness needs to be thickened when the first insulating film 41 is formed. Consequently, the film formation time for the first insulating film 41 is increased, which is not preferable. Furthermore, when the first groove 191x and the second groove 192x are formed by etching, the corner portions of the intersection 190x are rounded, and the groove width in diagonally intersecting directions is further widened than that in the state of FIG. 13.

Embodiment 2

Figure 15:
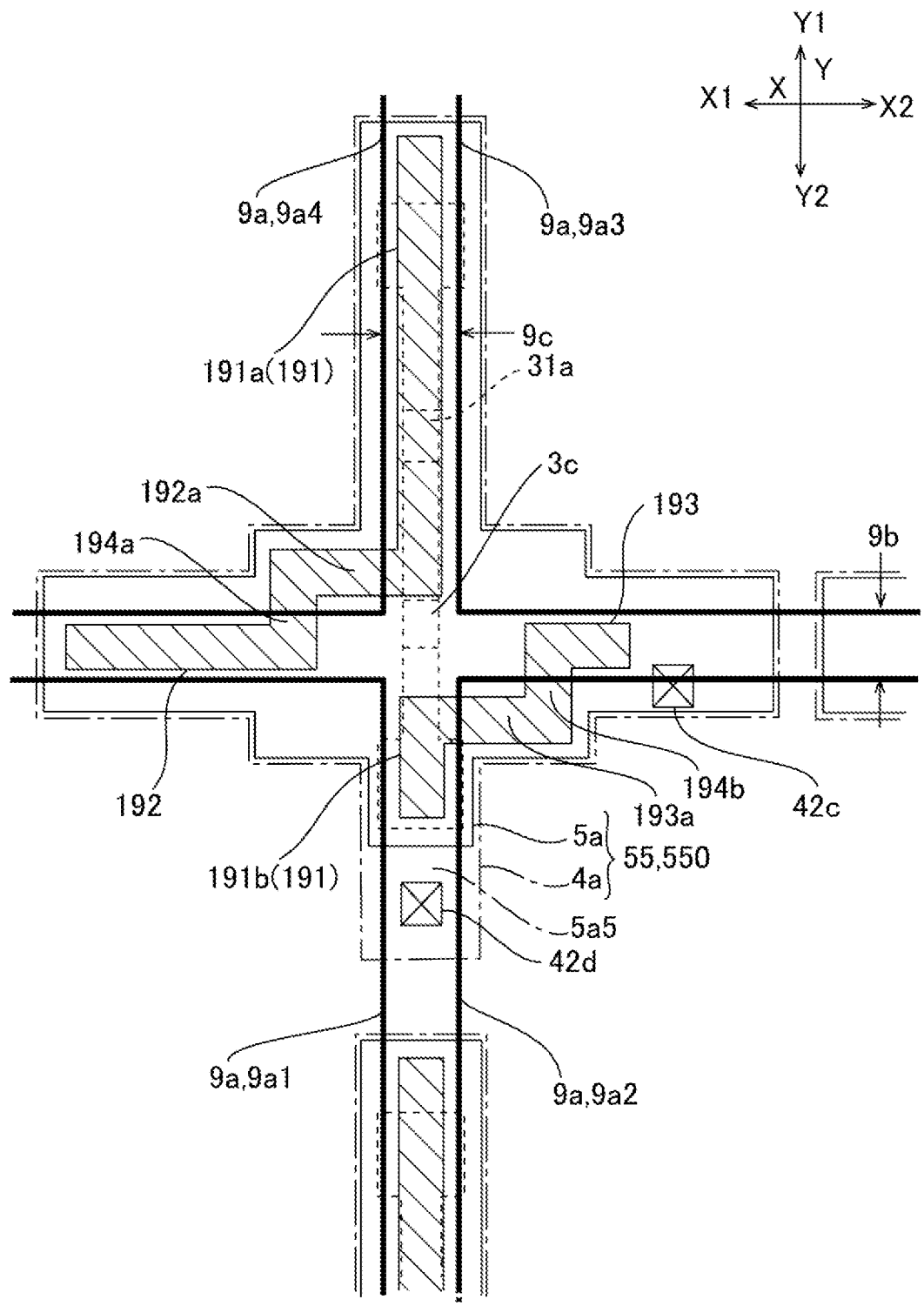
FIG. 15 is an explanatory diagram of an electro-optical device according to Embodiment 2 of the present disclosure.

FIG. 15 is an explanatory diagram of the electro-optical device 1 according to Embodiment 2 of the present disclosure, and illustrates a planar configuration in the vicinity of the transistor 30. Note that the basic configurations of the present embodiment are similar to those of Embodiment 1. Thus, common portions are assigned the same reference signs and description thereof will be omitted.

In the Embodiment 1, the second grooves 192 and 193 are provided on both sides of one first groove 191 extending in the Y-axis direction. In the present embodiment, however, as illustrated in FIG. 15, the first groove 191 is interrupted at an intermediate position in the extending direction, and the first groove 191 includes a first portion 191a, and a second portion 191b located on the second side Y2 in the Y-axis direction of the first portion 191a. In the present embodiment as well, the second grooves 192 and 193 are provided on both sides of the first groove 191. In the present embodiment, second grooves 192a and 193a extending in the X-axis direction in parallel with the second grooves 192 and 193, and first grooves 194a and 194b extending in the Y-axis direction in parallel with the first groove 191 are further provided on both sides of the first groove 191. Here, in the layered film 550, the second conductive film 5a overlaps the sidewalls and the bottom wall of each of the first portion 191a of the first groove 191, the second portion 191b of the first groove 191, the second grooves 192, 192a, 193, and 193a, and the first grooves 194a and 194b with the dielectric film 49 and the first conductive film 4a disposed therebetween. Accordingly, the capacitance element 55 has a greater capacitance than when the layered film 550 is formed at a flat surface alone.

Here, the first portion 191a of the first groove 191 and the second groove 192a are coupled to each other at an end thereof but do not intersect each other; the second groove 192a and the first groove 194a are coupled to each other at an end thereof but do not intersect each other; and the first groove 194a and the second groove 192 are coupled to each other at an end thereof but do not intersect each other. Furthermore, the second portion 191b of the first groove 191 and the second groove 193a are coupled to each other at an end thereof but do not intersect each other; the second groove 193a and the first groove 194b are coupled to each other at an end thereof but do not intersect each other; and the first groove 194b and the second groove 193 are coupled to each other at an end thereof but do not intersect each other. Accordingly, since the intersection 190x described above with reference to FIGS. 13 and 14 is not present in any of the first portion 191a of the first groove 191, the second portion 191b of the first groove 191, the second grooves 192, 192a, 193, and 193a, and the first grooves 194a and 194b, the groove width is narrow. Therefore, as described above with reference to FIG. 12, even when the recess 5a6 is generated in the surface of the second conductive film 5a, the first insulating film 41 easily fills the recess 5a6 when the first insulating film 41 is formed.

Embodiment 3

Figure 16:
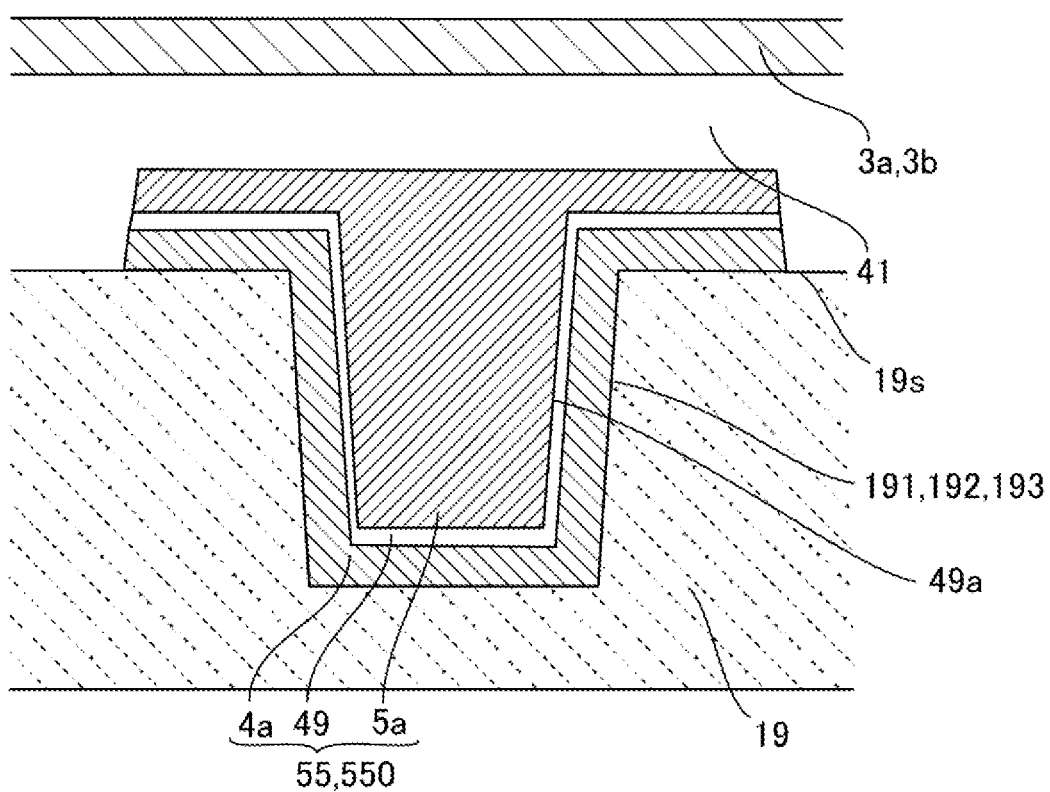
FIG. 16 is an explanatory diagram of an electro-optical device according to Embodiment 3 of the present disclosure.

FIG. 16 is an explanatory diagram of the electro-optical device 1 according to Embodiment 3 of the present disclosure. FIG. 16 schematically illustrates a cross-section of the capacitance element 55. Note that the basic configurations of the present embodiment are similar to those of Embodiments 1 and 2. Thus, common portions are assigned the same reference signs and description thereof will be omitted.

Embodiments 1 and 2 have a structure in which the recess 5a6 generated in the surface of the second conductive film 5a due to the first groove 191 and the second grooves 192 and 193 is filled by the first insulating film 41. However, as illustrated in FIG. 16, the present embodiment has a structure in which a recess 49a generated in the surface of the dielectric film 49 due to the first groove 191 and the second grooves 192 and 193 is filled by the second conductive film 5a. Even in such a structure, the first groove 191 and the second grooves 192 and 193 have a narrow groove width at any position. Therefore, even when the recess 49a resulting from the first groove 191 and the second grooves 192 and 193 is generated in the surface of the dielectric film 49, the second conductive film 5a easily fills the recess 49a when the second conductive film 5a is formed. The second conductive film 5a may have a two-layer structure. The first layer may be a film with a good coverage of the dielectric film 49, and the second layer may be a film that easily fills the recess 49a.

Embodiment 4

Figure 17:
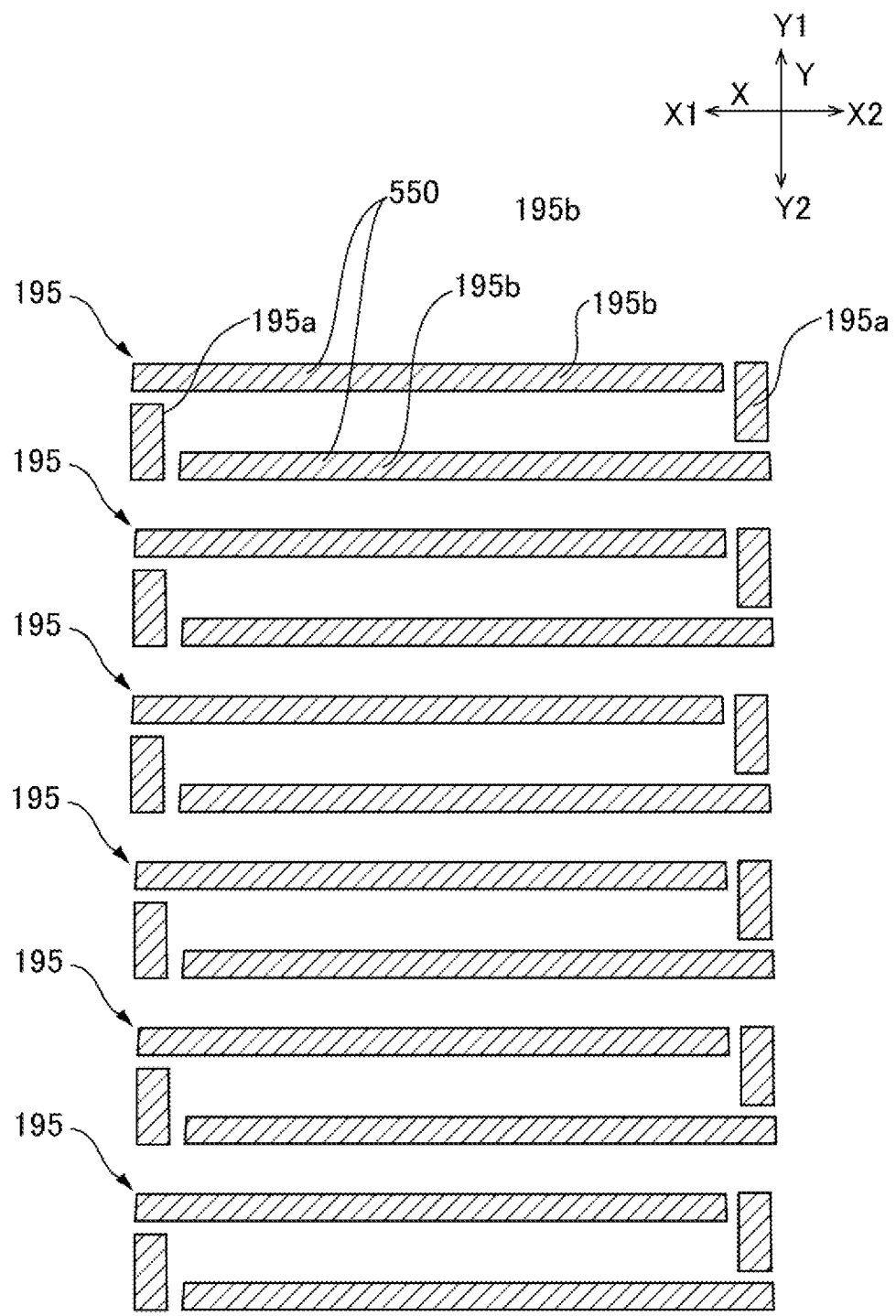
FIG. 17 is an explanatory diagram of an electro-optical device according to Embodiment 4 of the present disclosure.

FIG. 17 is an explanatory diagram of the electro-optical device 1 according to Embodiment 4 of the present disclosure. FIG. 17 schematically illustrates a planar structure of a first mark 195 formed in the first substrate 10. In the electro-optical device 1 according to Embodiments 1, 2, and 3, the first mark 195 illustrated in FIG. 17 may be formed on the outer side of the display region 10a of the first substrate 10. The first mark 195 is used as an alignment mark, or a measuring mark for step measurement or the like.

In forming the first mark 195, a third groove 195a, and a fourth groove 195b that does not intersect the third groove 195a and that extends in a direction intersecting the third groove 195a are formed in the same layer as that of the first groove 191 and the second grooves 192 and 193 described above with reference to FIGS. 6, 7, and 8. Furthermore, the third groove 195a and the fourth groove 195b are not coupled to each other. The third groove 195a and the fourth groove 195b form elongated quadrangles, and such quadrangles are disposed at predetermined intervals. Furthermore, the layered film 550 described above with reference to FIGS. 6, 7, and 8 is formed in a region including the third groove 195a and the fourth groove 195b, for example, along the third groove 195a and the fourth groove 195b. Even in such an aspect, since the third groove 195a and the fourth groove 195b do not intersect each other, recesses resulting from the third groove 195a and the fourth groove 195b can be easily filled.

Modified Example of Embodiment 4

Figure 18:
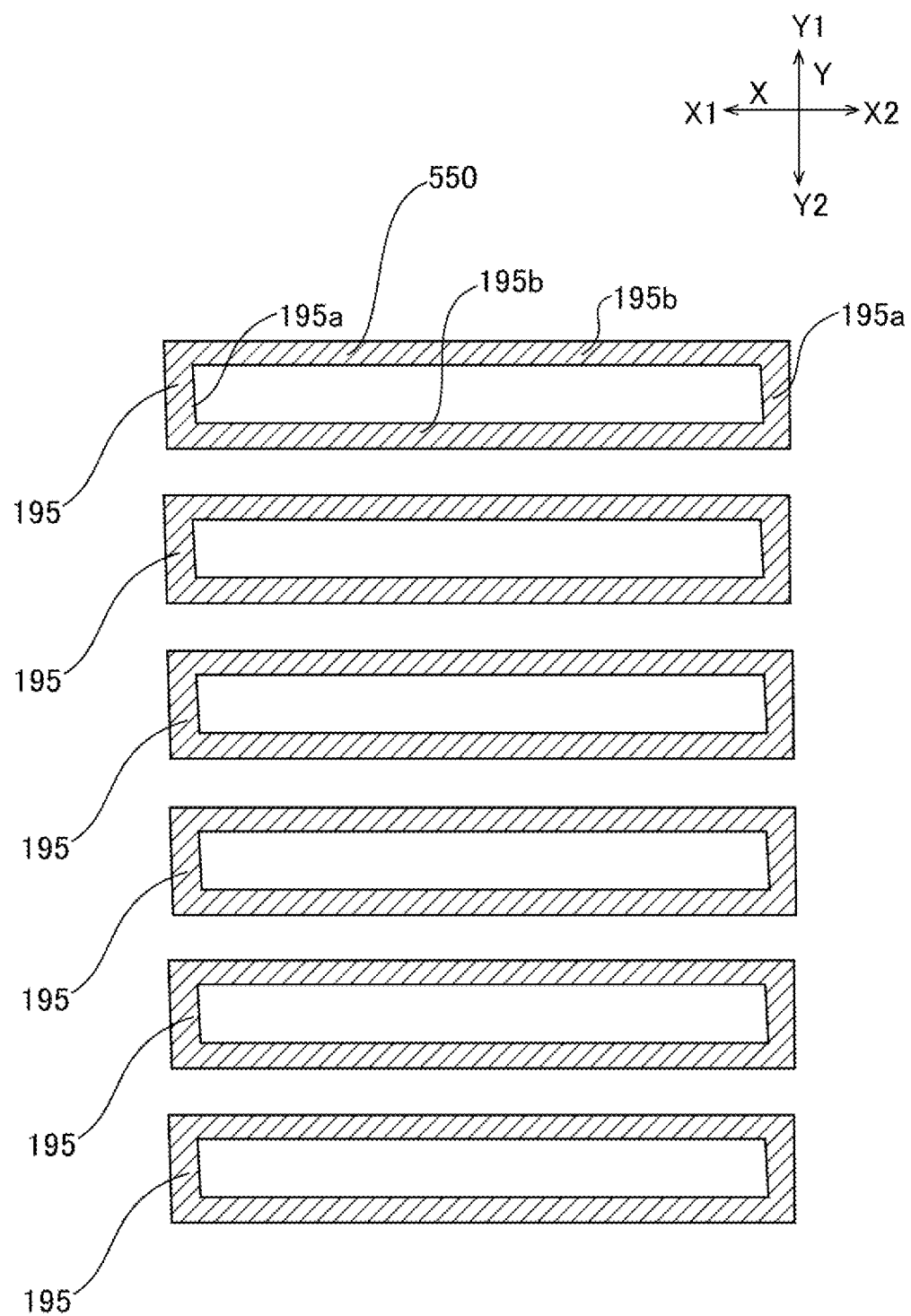
FIG. 18 is an explanatory diagram of an electro-optical device according to a modified example of Embodiment 4 of the present disclosure.

FIG. 18 is an explanatory diagram of the electro-optical device 1 according to a modified example of Embodiment 4 of the present disclosure. FIG. 18 schematically illustrates a planar structure of the first mark 195 formed in the first substrate 10. In Embodiment 4, the third groove 195a and the fourth groove 195b are not coupled to each other. In contrast, in the present embodiment, as illustrated in FIG. 18, the third groove 195a and the fourth groove 195b are coupled to each other. However, the third groove 195a and the fourth groove 195b do not intersect each other. Even in such a configuration, similar to Embodiment 4, recesses resulting from the third groove 195a and the fourth groove 195b can be easily filled.

Embodiment 5

Figure 19:
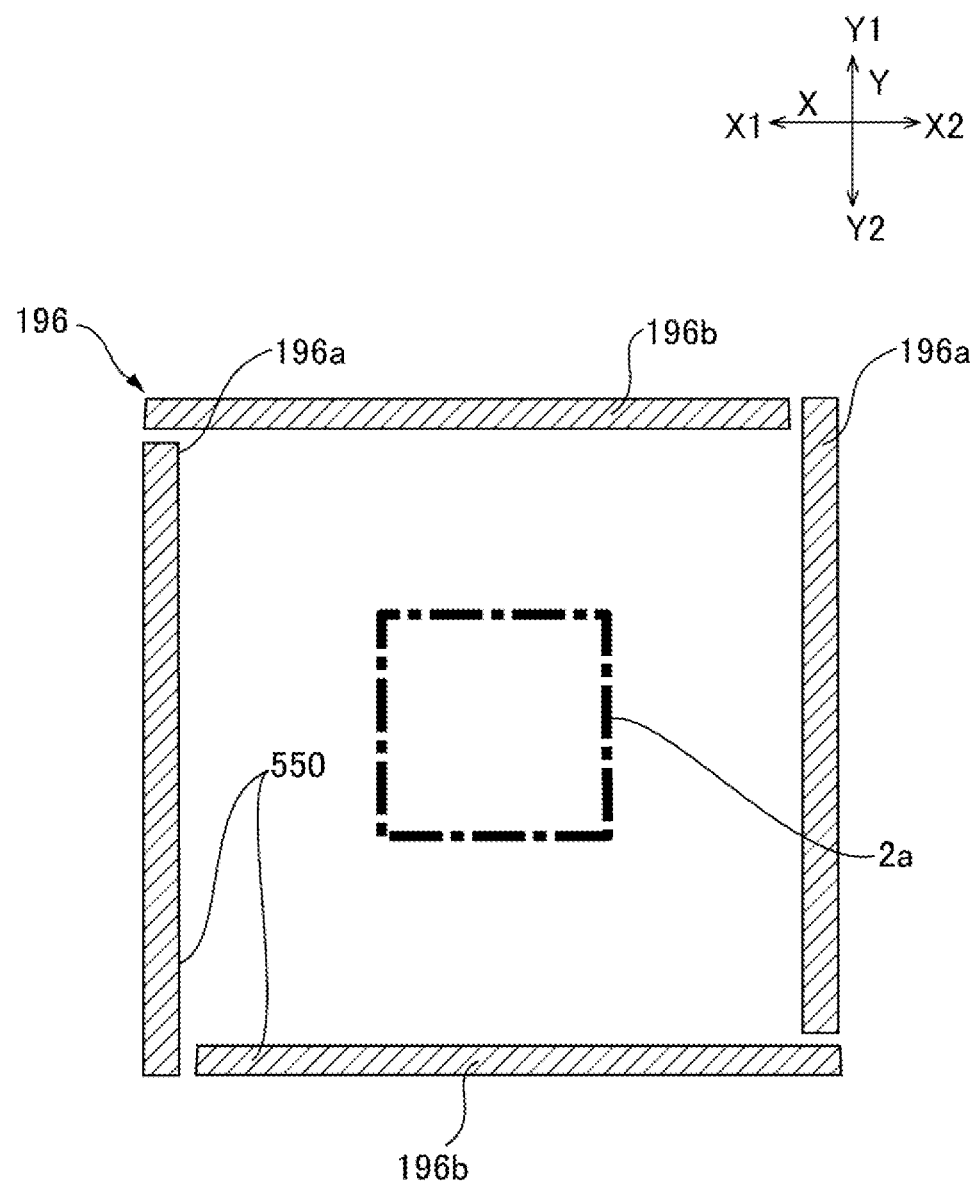
FIG. 19 is an explanatory diagram of an electro-optical device according to Embodiment 5 of the present disclosure.

FIG. 19 is an explanatory diagram of the electro-optical device 1 according to Embodiment 5 of the present disclosure. FIG. 19 schematically illustrates a planar structure of a first mark 196 formed in the first substrate 10. In the electro-optical device 1 according to Embodiments 1, 2, and 3, the first mark 196 illustrated in FIG. 19 may be formed on the outer side of the display region 10a of the first substrate 10. The first mark 196 is used as an alignment mark, or a measuring mark for step measurement or the like. Furthermore, the first mark 196 is used to evaluate accuracy when forming a resin pattern 2a and the like using a photolithographic technique.

In forming the first mark 196, a third groove 196a, and a fourth groove 196b that does not intersect the third groove 196a and that extends in a direction intersecting the third groove 196a are formed in the same layer as that of the first groove 191 and the second grooves 192 and 193 described above with reference to FIGS. 6, 7, and 8. Furthermore, the third groove 196a and the fourth groove 196b are not coupled to each other. The third grooves 196a and the fourth grooves 196b form a quadrangle, and the resin pattern 2a and the like are formed on the inner side of such a quadrangle. Furthermore, the layered film 550 described above with reference to FIGS. 6, 7, and 8 is formed in a region including the third groove 196a and the fourth groove 196b, for example, along the third groove 196a and the fourth groove 196b. Even in such an aspect, since the third groove 196a and the fourth groove 196b do not intersect each other, recesses resulting from the third groove 196a and the fourth groove 196b can be easily filled.

Modified Example of Embodiment 5

Figure 20:
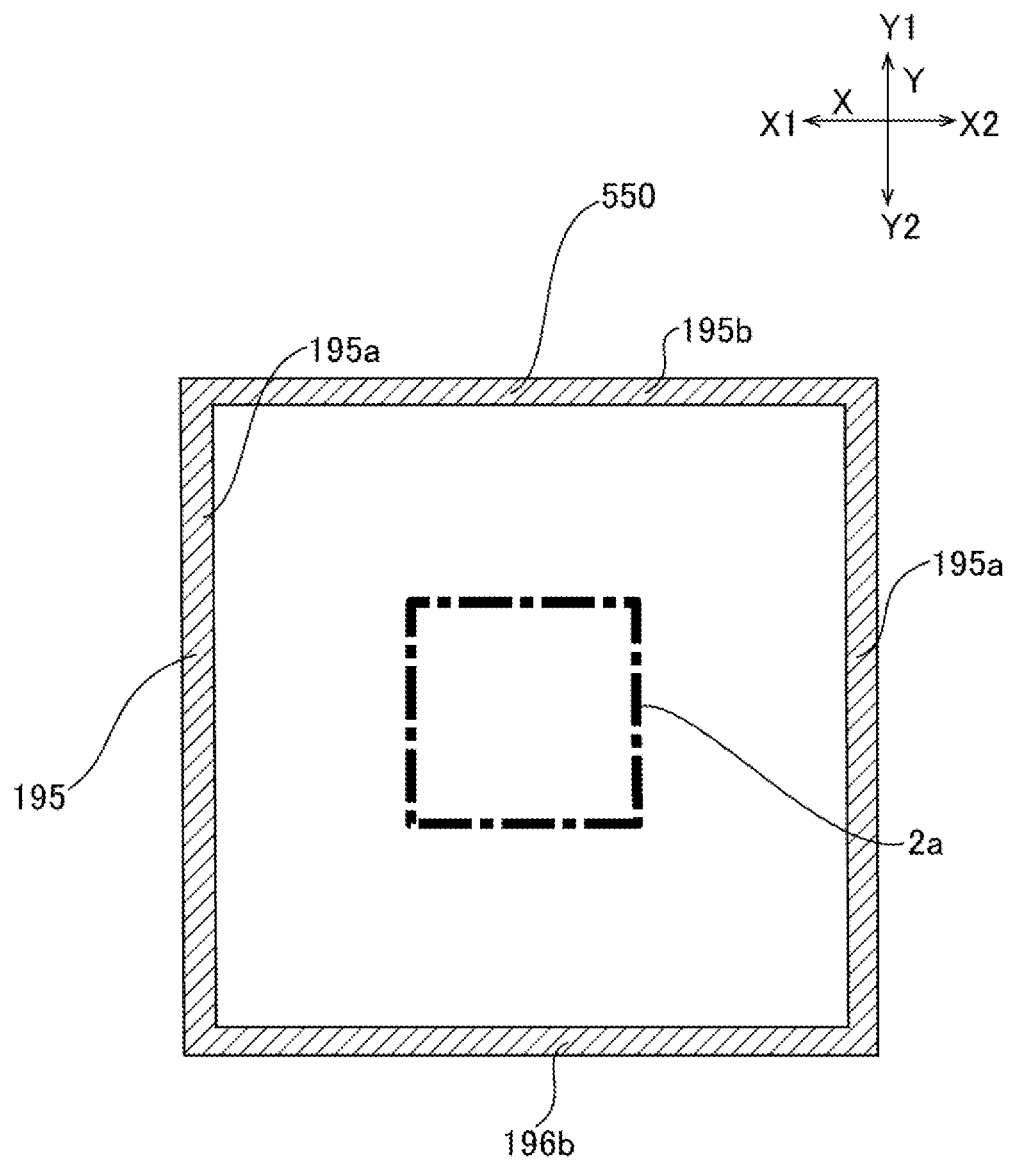
FIG. 20 is an explanatory diagram of an electro-optical device according to a modified example of Embodiment 5 of the present disclosure.

FIG. 20 is an explanatory diagram of the electro-optical device 1 according to a modified example of Embodiment 5 of the present disclosure. FIG. 19 schematically illustrates a planar structure of a first mark 196 formed in the first substrate 10. In Embodiment 5, the third groove 196a and the fourth groove 196b are not coupled to each other. In the present embodiment, as illustrated in FIG. 20, the third groove 196a and the fourth groove 196b are coupled to each other, but do not intersect each other. Even in such a configuration, similar to Embodiment 5, recesses resulting from the third groove 196a and the fourth groove 196b can be easily filled.

Embodiment 6

Figure 21:
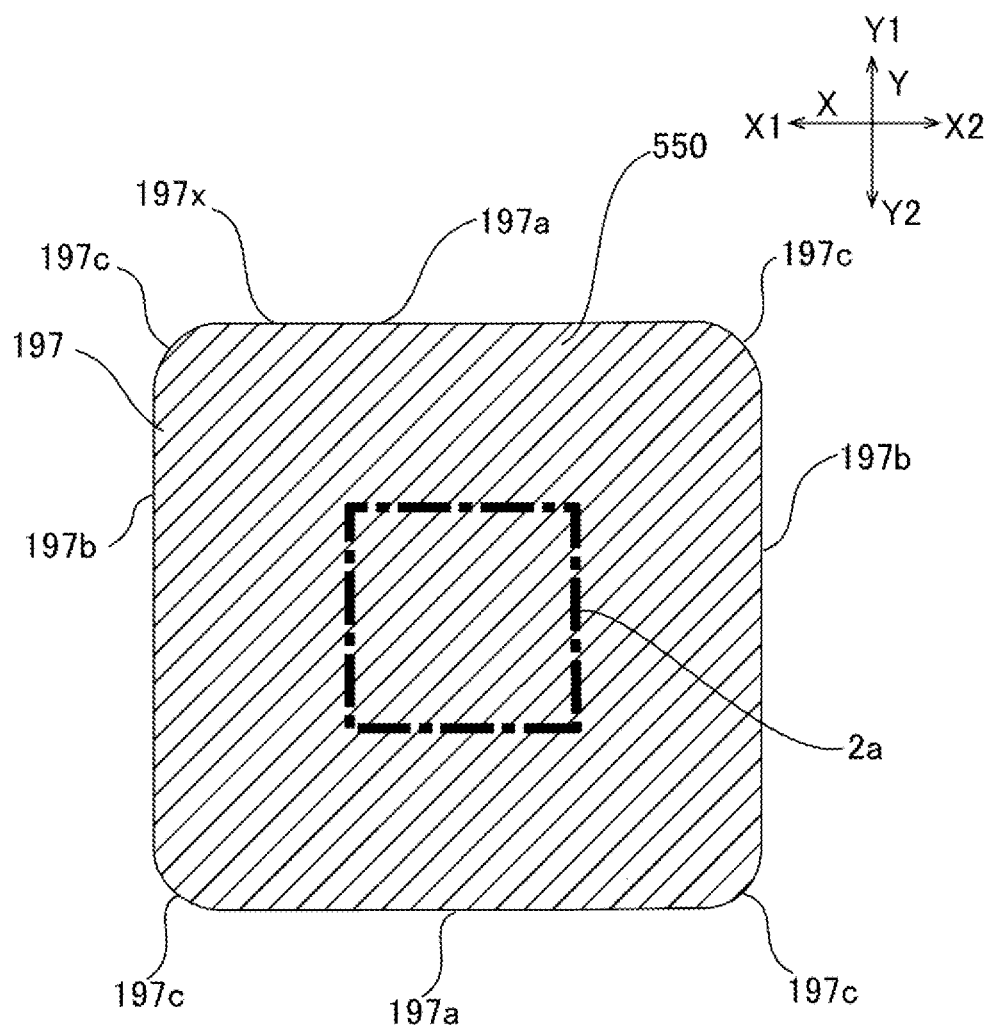
FIG. 21 is an explanatory diagram of an electro-optical device according to Embodiment 6 of the present disclosure.

FIG. 21 is an explanatory diagram of the electro-optical device 1 according to Embodiment 6 of the present disclosure. FIG. 21 schematically illustrates a planar structure of a second mark 197 formed in the first substrate 10. In the electro-optical device 1 according to Embodiments 1, 2, and 3, the second mark 197 illustrated in FIG. 21 may be formed on the outer side of the display region 10a of the first substrate 10. The first mark 196 is used as an alignment mark, or a measuring mark for step measurement or the like. Furthermore, the second mark 197 is used to evaluate accuracy when forming a resin pattern 2a and the like using a photolithographic technique.

In forming the second mark 197, a planar-shaped recess 197x, of which a plurality of linear portions 197a and 197b extending at the outer edge are coupled via curved portions 197c, is formed in the same layer as that of the first groove 191 and the second grooves 192 and 193 described above with reference to FIGS. 6, 7, and 8. Furthermore, the layered film 550 described above with reference to FIGS. 6, 7, and 8 is formed in a region including the recess 197x. According to such an aspect, since the plurality of linear portions 197a and 197b are coupled via curved portions 197c, stress is less likely to be applied to the layered film 550. Therefore, cracks and the like are less likely to be generated in the layered film 550.

Other Embodiments

In the above-described embodiments, cases have been described in which the light-shielding film 3b provided between the transistor 30 and the substrate body 19 is the scanning line 3a. However, when the gate electrode 33a is part of the scanning line, the light-shielding film 3b may be a light-shielding film separate from the scanning line.

In the above-described embodiments, the semiconductor film 31a extends in the Y-axis direction. However, the present disclosure may be applied to cases in which the semiconductor film 31a extends in the X-axis direction. Furthermore, in the above-described embodiments, the first groove 191 extends in the Y-axis direction. However, the present disclosure may be applied to cases in which the first groove 191 extends in the X-axis direction.

In the above-described embodiments, cases have been described in which the transistor 30 has an LDD structure. However, the present disclosure may be applied to cases of an offset gate structure, in which the high concentration regions 31d1 and 31s1 are spaced apart from the ends of the gate electrode 33a. In this case, the regions in which impurities have not been introduced between the high concentration regions 31d1 and 31s1 and the ends of the gate electrode 33a are the low concentration regions 31d2 and 31s2.

The marks illustrated in FIGS. 17, 18, 19, 20, and 21 can be applied to cases in which such marks are formed in the first substrate 10, and may be applied to cases in which, in a large substrate to be divided into first substrates 10, such marks are formed in a region other than the regions to be divided as first substrates 10.

In the above-described embodiments, cases in which the capacitance element 55 is formed at the first substrate 10 of a liquid crystal device are illustrated as examples. However, the present disclosure may be applied to cases in which the capacitance element 55 is formed at a substrate of an organic electroluminescence device.

Installation Example to Electronic Apparatus

Figure 22:
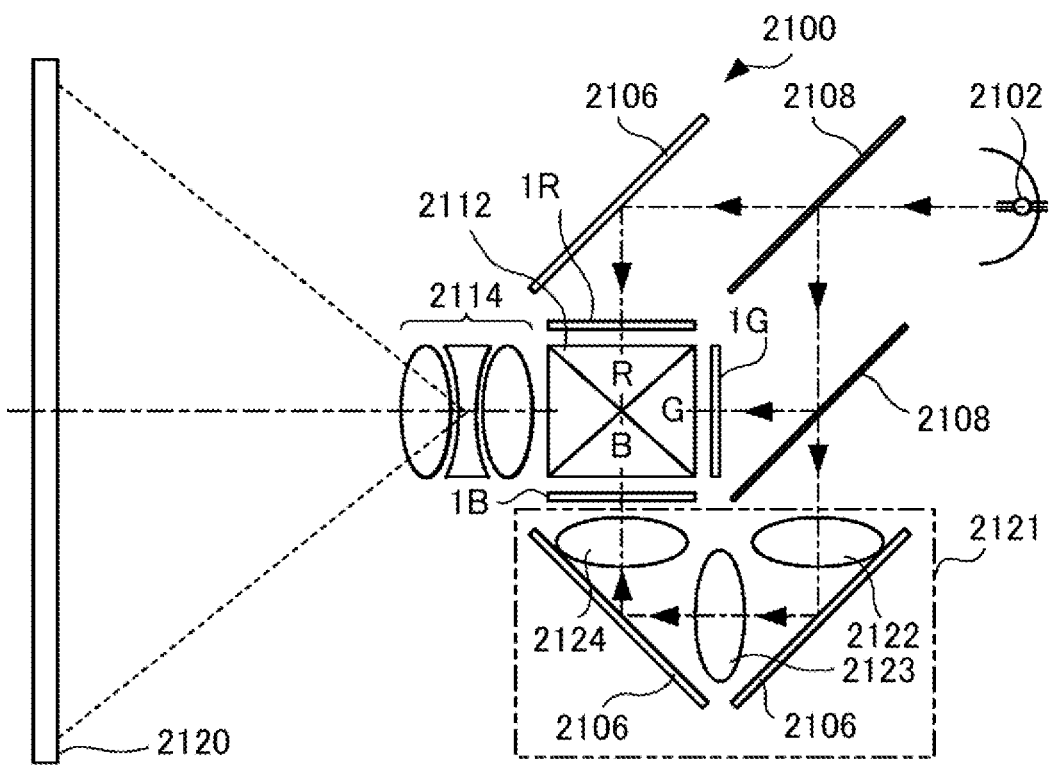
FIG. 22 is a schematic configuration diagram of a projection-type display device that uses an electro-optical device to which the present disclosure is applied.

An electronic apparatus that uses the electro-optical device 1 according to the above-described embodiments will be described. FIG. 22 is a schematic configuration diagram of a projection-type display device that uses the electro-optical device 1 to which the present disclosure is applied. In FIG. 22, illustration of an optical element such as a polarizing plate is omitted. A projection-type display device 2100 illustrated in FIG. 22 is an example of an electronic apparatus that uses the electro-optical device 1.

In the projection-type display device 2100 illustrated in FIG. 22, the electro-optical device 1 is used as light valves, and a high-definition, bright display is made possible without increasing the size of the device. As illustrated in FIG. 22, a lamp unit 2102 (light source unit) including a white light source such as a halogen lamp is provided inside the projection-type display device 2100. Projection light emitted from the lamp unit 2102 is split into three primary colors of red (R) color, green (G) color, and blue (B) color by three mirrors 2106 and two dichroic mirrors 2108 disposed inside. The split projection light is each guided to a light valve 1R, 1G, or 1B corresponding to each of the primary colors, and modulated. Note that since it has a longer optical path as compared to the other light of the R color and the G color, the light of the B color is guided via a relay lens system 2121 including an incidence lens 2122, a relay lens 2123, and an emission lens 2124 to prevent the loss of the light of the B color.

The light modulated by the light valves 1R, 1G, and 1B is incident on a dichroic prism 2112 from three directions. Then, at the dichroic prism 2112, the light of the R color and the light of the B color are reflected at 90 degrees, while the light of the G color is transmitted. Accordingly, after images of the respective primary colors are synthesized, a color image is projected on a screen 2120 by a projection lens group 2114 (projection optical system).

Other Projection-type Display Devices

Note that the projection-type display device may use an LED light source or the like that emits light of each color as a light source unit, and supply the light of each color emitted from such an LED light source to another liquid crystal device.

Other Electronic Apparatuses

Electronic apparatuses that include the electro-optical device 1 to which the present disclosure is applied are not limited to the projection-type display device 2100 of the above-described embodiment. For example, the electro-optical device 1 to which the present disclosure is applied may be used in electronic apparatuses such as a projection-type head-up display (HUD), a direct-view-type head-mounted display (HMD), a personal computer, a digital still camera, and a liquid crystal television.

What is claimed is:

1. An electro-optical device comprising:
   a substrate body including
      a first groove and
      a second groove provided away from the first groove and extending along a direction intersecting an extending direction of the first groove;
   a layered film including a first conductive film, a dielectric film, and a second conductive film sequentially layered in a region overlapping the first groove and the second groove; and
   a first insulating film covering the layered film.

2. The electro-optical device according to claim 1, wherein the second groove is disposed on both sides of the first groove.

3. An electro-optical device comprising:
a substrate body including
a first groove including a first portion and a second portion provided away from the first portion and
a second groove extending along a direction different from an extending direction of the first groove;
a layered film including a first conductive film, a dielectric film, and a second conductive film sequentially layered in a region overlapping the first groove and the second groove; and
a first insulating film covering the layered film.

4. The electro-optical device according to claim 1, wherein
the layered film constitutes a capacitance element, and
in the layered film, the second conductive film overlaps a sidewall and a bottom wall of each of the first groove and the second groove, with the dielectric film and the first conductive film disposed therebetween.

5. The electro-optical device according to claim 4, comprising:
a pixel electrode;
a scanning line extending along a first direction in a layer between the substrate body and the pixel electrode;
a data line extending along a second direction intersecting the first direction in a layer between the substrate body and the pixel electrode; and
a transistor provided corresponding to an intersection between the scanning line and the data line and including a semiconductor film, wherein
the first groove extends along one direction of the first direction and the second direction and
the second groove extends along the other direction of the first direction and the second direction.

6. The electro-optical device according to claim 5, wherein
the semiconductor film extends along the one direction and
the first groove extends in the one direction so as to overlap the semiconductor film.

7. The electro-optical device according to claim 5, wherein the capacitance element is provided between the substrate body and the semiconductor film.

8. The electro-optical device according to claim 6, comprising:
between the second conductive film and the semiconductor film, a light-shielding film overlapping the semiconductor film from a substrate body side; and
a second insulating film provided between the light-shielding film and the semiconductor film, wherein
in a region overlapping the first groove and the second groove in plan view, a surface on a light-shielding film side of the first insulating film is a continuous flat surface.

9. The electro-optical device according to claim 8, wherein the light-shielding film constitutes the scanning line.

10. The electro-optical device according to claim 3, wherein the second groove is coupled to the first groove.

11. The electro-optical device according to claim 5, wherein
on an outer side of a display region provided with the pixel electrode, a third groove, a fourth groove provided away from the third groove and extending in a direction intersecting the third groove, and a first mark are provided, and
the layered film constitutes the first mark in a region including the third groove and the fourth groove.

12. The electro-optical device according to claim 5, wherein
on an outer side of a display region provided with the pixel electrode, a recess provided in the substrate body and a second mark are provided,
the recess includes a planar shape with a plurality of linear portions, extending at an outer edge of the recess and coupled via curved portions, and
the layered film constitutes the second mark in a region including the recess.

13. An electronic apparatus comprising the electro-optical device according to claim 1.

* * * * *